US011581209B2

(12) United States Patent
Steffens et al.

(10) Patent No.: US 11,581,209 B2
(45) Date of Patent: Feb. 14, 2023

(54) ENVIRONMENTAL CONTROL MATERIAL HOLDER

(71) Applicant: ENTEGRIS, INC., Billerica, MA (US)

(72) Inventors: Jason T. Steffens, Shakopee, MN (US); Andrew Harris, Minneapolis, MN (US); Michael C. Zabka, New Prague, MN (US); B. Jorden Lundgren, Gomersal (GB); Bryant L. Lymburn, Coon Rapids, MN (US)

(73) Assignee: ENTEGRIS, INC., Billerica, MA (US)

( * ) Notice: Subject to any disclaimer, the term of this patent is extended or adjusted under 35 U.S.C. 154(b) by 81 days.

(21) Appl. No.: 17/091,642

(22) Filed: Nov. 6, 2020

(65) Prior Publication Data

US 2021/0143040 A1    May 13, 2021

Related U.S. Application Data

(60) Provisional application No. 62/932,748, filed on Nov. 8, 2019.

(51) Int. Cl.
*H01L 21/673* (2006.01)

(52) U.S. Cl.
CPC .. *H01L 21/67393* (2013.01); *H01L 21/67383* (2013.01); *H01L 21/67386* (2013.01)

(58) Field of Classification Search
CPC ......... H01L 21/67393; H01L 21/67383; H01L 21/67386; B65D 81/264; B65D 85/30
USPC ...................................................... 206/710
See application file for complete search history.

(56) References Cited

U.S. PATENT DOCUMENTS

| | | | |
|---|---|---|---|
| 5,346,518 A | 9/1994 | Baseman | |
| 6,209,717 B1 | 4/2001 | Flynn | |
| 7,528,936 B2 | 5/2009 | Gregerson | |
| 8,776,841 B2 | 7/2014 | Kishkovich | |
| 8,888,086 B2 | 11/2014 | Rastegar | |
| 9,054,144 B2 | 6/2015 | Burns | |
| 2004/0074807 A1 | 4/2004 | Chih-Kang | |
| 2005/0077204 A1 | 4/2005 | Sumi | |
| 2009/0266441 A1* | 10/2009 | Sato ..................... | F16K 15/063 141/98 |
| 2011/0114534 A1 | 5/2011 | Watson et al. | |
| 2011/0139675 A1 | 6/2011 | Ku | |
| 2014/0016730 A1 | 1/2014 | Yanagisawa | |
| 2015/0041360 A1 | 2/2015 | Watson | |

(Continued)

FOREIGN PATENT DOCUMENTS

| | | |
|---|---|---|
| CN | 214987021 U | 12/2021 |
| JP | 3019386 U | 12/1995 |

(Continued)

*Primary Examiner* — J. Gregory Pickett
*Assistant Examiner* — Jenine Pagan

(57) ABSTRACT

Environmental control material holders can retain environmental control material within wafer carriers, allowing the environmental control material to protect wafers from moisture while also securing the environmental control material. The environmental control material holders may include a baseplate and tabs defining spaces to hold environmental control material, and can be configured to engage a handle of a wafer cassette. The environmental control material holders may retain one or more environmental control materials. Additionally, the environmental control material holders can be configured to also retain a humidity indicator.

12 Claims, 15 Drawing Sheets

(56) References Cited

U.S. PATENT DOCUMENTS

| | | | |
|---|---|---|---|
| 2015/0117986 A1 | 4/2015 | Lai | |
| 2018/0138065 A1* | 5/2018 | King | |
| 2019/0067044 A1* | 2/2019 | Huang | ............... H01L 21/6732 |
| 2020/0009501 A1* | 1/2020 | Sussman | ............... F25B 39/04 |

FOREIGN PATENT DOCUMENTS

| | | | |
|---|---|---|---|
| JP | 2002176097 A | 6/2002 | |
| JP | 2012157275 A | 8/2012 | |
| KR | 20040002969 A | 1/2004 | |
| KR | 20080049814 A | 6/2008 | |
| KR | 20120007311 U | 10/2012 | |
| TW | 201703174 A | 1/2017 | |
| TW | 201724325 A | 7/2017 | |
| WO | 0247152 W | 6/2002 | |

* cited by examiner

ENVIRONMENTAL CONTROL MATERIAL HOLDER

CROSS-REFERENCE TO RELATED APPLICATION

This application claims the benefit of and priority to U.S. Provisional Application No. 62/932,748 filed on Nov. 8, 2019, the entirety of which is incorporated herein by reference for all purposes.

TECHNICAL FIELD

This disclosure is directed to semiconductor substrate carriers including environmental control material holders.

BACKGROUND

Wafer carriers may store wafers for periods of time, for example, prior to or following processing, or between processing steps. During this time, moisture may enter the wafer carrier. Moisture may cause damage to, or degradation of, wafers within the wafer carrier.

SUMMARY

This disclosure is directed to semiconductor substrate carriers including environmental control material holders.

By using environmental control material holders positioned within a semiconductor substrate carrier such as a wafer carrier or shipping unit, environmental control material can be secured within the wafer carrier. This allows the wafers within the wafer carrier to be protected from moisture while reducing risk of loose elements moving within the wafer carrier during, for example, transport or any shock events such as dropping or other sudden acceleration or deceleration. Risk of damage to the wafers is thereby reduced.

In an embodiment, an environmental control material holder for a wafer carrier includes a baseplate and one or more tabs. At least one of the one or more tabs includes a retaining feature configured to engage with a handle of a wafer cassette. The baseplate and each of the one or more tabs are spaced such that an environmental control material may be located within each of the one or more spaces.

In an embodiment, the environmental control material holder further includes a plurality of environmental control material retention tabs extending from the baseplate and configured to retain the environmental control material in one of the one or more spaces.

In an embodiment, the one or more tabs are a plurality of tabs, and the baseplate includes a channel located between two of the plurality of tabs in plan view.

In an embodiment, the environmental control material holder includes at least one polymer material selected from the group consisting of: polyolefins, polyether ether ketone (PEEK), perfluoroalkoxy alkane (PFA), and combinations thereof.

In an embodiment, the environmental control material holder further includes an environmental control material. Non-limiting examples of environmental control material include at least one of a desiccant, an ionic absorbent, a volatile organic compound absorbent, or combinations thereof. Alternatively, the environmental control material may be a material that performs multiple functions such as acting as a desiccant and an ionic absorbent. In an embodiment the environmental control material includes at least one of silica gel, bentonite clay activated charcoal, calcium sulfate, calcium chlorite, or zeolites.

In an embodiment, the retaining feature is configured to form a snap-fit with the handle of the wafer cassette.

In an embodiment, an environmental control material holder for a wafer carrier includes a pin configured to interface with an aperture of a wafer cassette, located at a first end of the environmental control material holder. The environmental control material holder also includes a securing feature configured to engage with a wafer cassette, located at a second end of the environmental control material holder, opposite the first end. Then environmental control material holder further includes an environmental control material retainer, including one or more beams.

In an embodiment, the environmental control material retainer includes two beams, each of the beams including a retention tab extending from the beam.

In an embodiment, the environmental control material retainer includes a curved portion and a straight portion, the curved portion extending from the securing feature to a junction with the straight portion, the pin located at an end of the straight portion. In an embodiment, the straight portion includes side walls defining an internal space.

In an embodiment, the environmental control material holder includes at least one polymer material selected from the group consisting of: a polyolefin, a polyether ether ketone (PEEK), a perfluoroalkoxy alkane (PFA), and combinations thereof.

In an embodiment, the environmental control material holder further includes an environmental control material including at least one of a desiccant, an ionic absorbent, or a volatile organic compound absorbent. In an embodiment, the environmental control material includes at least one of silica gel, bentonite clay activated charcoal, calcium sulfate, calcium chlorite, or zeolites.

In an embodiment, an environmental control material holder includes one or more environmental control material retainers, each including a base configured to fit in a corner of a base of a wafer carrier and a plurality of beams configured to retain an environmental control material.

In an embodiment, the environmental control material holder includes a plurality of the environmental control material retainers, one or more arms, each of the one or more arms connecting two environmental control material retainers of the plurality of environmental control material retainers, and one or more spring arms extending from each of the one or more arms, each of the one or more spring arms configured to contact a wafer cassette when the bases of the plurality of environmental control material retainers are in the corners of the base of the wafer carrier and the wafer cassette is located within the wafer carrier.

In an embodiment, two or more spring arms extend from each of the one or more arms.

In an embodiment, the environmental control material holder includes at least one polymer material selected from the group consisting of: a polyolefin, a polyether ether ketone (PEEK), a perfluoroalkoxy alkane (PFA), and combinations thereof.

In an embodiment, the environmental control material holder further includes an environmental control material including at least one of a desiccant, an ionic absorbent, or a volatile organic compound absorbent. In an embodiment, the environmental control material includes at least one of silica gel, bentonite clay activated charcoal, calcium sulfate, calcium chlorite, or zeolites.

DRAWINGS

The disclosure may be more completely understood in consideration of the following description of various illustrative embodiments in connection with the accompanying drawings.

Figure 1A:
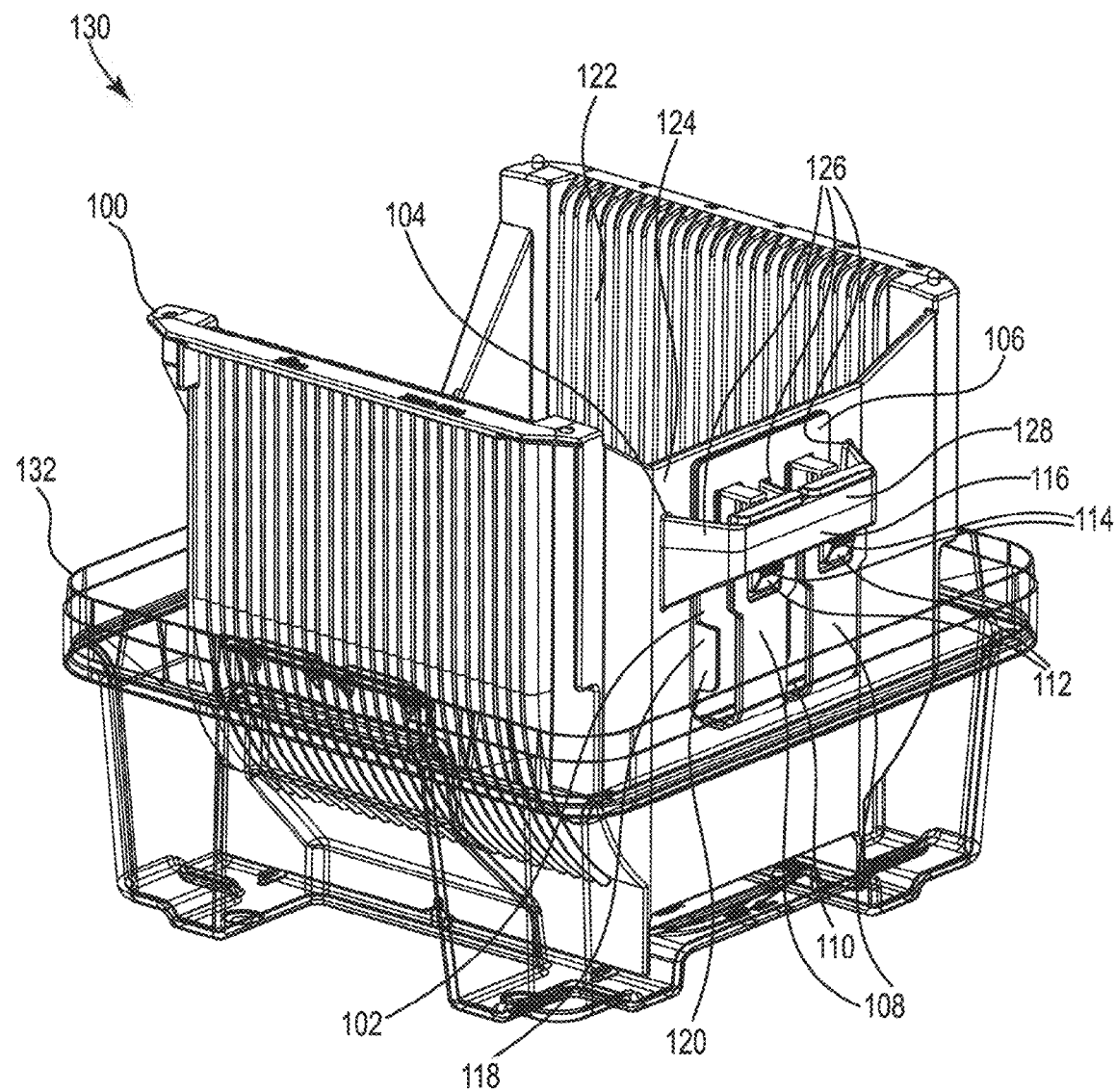
FIG. 1A shows a wafer cassette including an environmental control material holder according to an embodiment.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DETAILED DESCRIPTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

The following detailed description should be read with reference to the drawings in which similar elements in different drawings are numbered the same. The detailed description and the drawings, which are not necessarily to scale, depict illustrative embodiments and are not intended to limit the scope of the disclosure. The illustrative embodiments depicted are intended only as exemplary. Selected features of any illustrative embodiment may be incorporated into an additional embodiment unless clearly stated to the contrary.

Figure 1B:
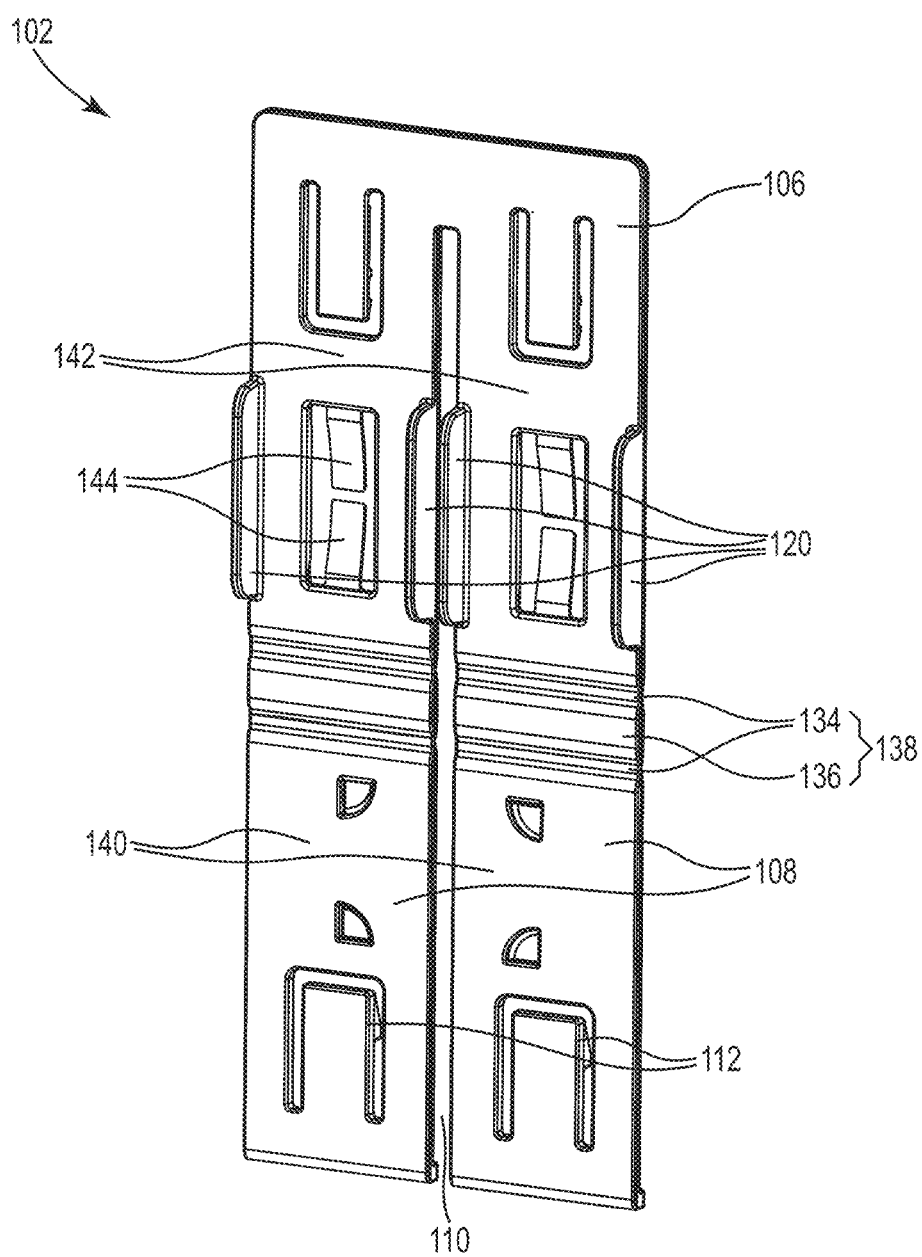
FIG. 1B shows an environmental control material holder according to an embodiment.

FIG. 1A shows a wafer carrier 130 including a wafer cassette 100 and environmental control material holder 102 provided in accordance with an embodiment of the disclosure. FIG. 1B shows the environmental control material holder 102 of FIG. 1A in an open configuration.

Wafer carrier 130 can be a container for storage or shipping of semiconductor wafers prior to, during, and subsequent to processing of those wafers. In one embodiment, wafer carrier 130 is a wafer storage unit. Wafer carrier 130 includes an outer shell 132 in addition to wafer cassette 100. Outer shell 132 may include a top portion (not shown) configured to attach to the bottom portion of outer shell 132 shown in FIG. 1A, to enclose wafer cassette 100.

Wafer cassette 100 is configured to hold a plurality of wafers within the wafer carrier 130. Wafer cassette 100 may be any suitable wafer cassette, such as 25-wafer cassettes used with wafer carriers. Wafers may be held within wafer cassette 100 within an internal space 122 defined by the walls of the wafer cassette 100. Wafer cassette 100 includes handle 104. Handle 104 may be disposed on an outer surface 124 of one of the walls of the wafer cassette 100.

Wafer cassette 100 may be made of a polymer material. In an embodiment, the polymer material is a melt-processable polymer having a low water vapor transmission rate. In an embodiment, the polymer material is a polyolefin. In an embodiment, the polymer material is a material selected from a polyolefin (such as a high-density polyethylene (HDPE) or polypropylene (PP)), polyether ether ketone (PEEK), perfluoroalkoxy alkane (PFA), or any other suitable melt-processable polymers, and combinations thereof. In an embodiment, the polymer material is polypropylene.

Handle 104 is a handle provided on wafer cassette 100. Handle 104 may include one or more handle supports 126 extending from the outer surface 124 of wafer cassette 100, and a crossbar 128 positioned away from the outer surface 124, at the ends of the handle supports 126. In an embodiment, handle 104 includes three handle supports 126 extending from wafer cassette 100 and the crossbar 128 joining those three handle supports 126 to form the handle 104. In an embodiment, the handle supports 126 may be distributed evenly such that a distance between each adjacent handle support 126 is the same, for example, where there are three handle supports 126, the second handle support 126 may be at a midpoint between the first and third handle supports 126.

Environmental control material holder 102 is secured to wafer cassette 100 at handle 104, and configured to hold an environmental control material (not shown) such as, but not limited to, one or more packets containing environmental control materials. Environmental control material holder 102 includes baseplate 106 and tabs 108. Channel 110 is formed in baseplate 106 between tabs 108. Each of tabs 108 includes a retaining feature 112 configured to form a snap-fit with handle 104 of wafer cassette 100. Each retaining feature 112 may include a ramped surface 114 configured to allow insertion of environmental control material holder 102 into the handle 104 and an engagement surface 116 configured to retain environmental control material holder 102 in place by way of contact with handle 104. Tabs 108 and the baseplate 106 combine to define environmental control material storage spaces 118 between them. The environmental control material storage spaces 118 are further defined by environmental control material retention tabs 120 extending from one of baseplate 106 as shown in FIG. 1A, or extending from tabs 108. An environmental control material (not shown) may be included in one or more of the environmental control material storage spaces 118. In an embodiment, a relative humidity (RH) indicator card can be included in addition to or in place of an environmental control material.

Environmental control materials (not shown) include materials that can be used to control the environment within wafer carrier 130. The environmental control materials may be, for example, materials to control one or more of relative humidity, or the presence or concentrations of ions or concentrations of volatile organic compounds (VOC) within the wafer carrier 130. The environmental control materials can include a desiccant that can absorb moisture from within the wafer carrier 130 including environmental control material holder 102. The environmental control material can include an ionic absorbent. The environmental control material can include a VOC absorbent. In other embodiments, the environmental control material may offer multiple functions, such as moisture and ionic absorption. Suitable environmental control materials can include, as non-limiting examples, silica gel, bentonite clay activated charcoal, calcium sulfate, calcium chloride, zeolites, or any other suitable environmental control material.

Figure 1C:
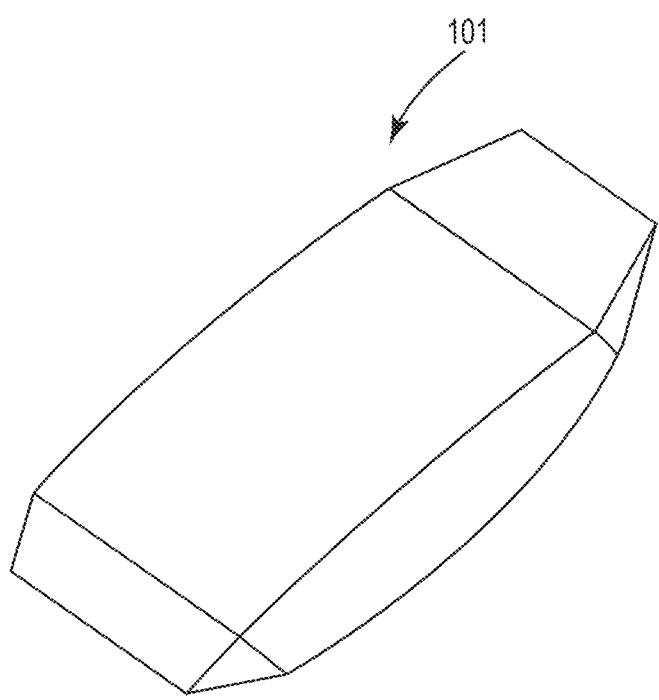
FIG. 1C shows a packet for holding an environmental control material in accordance with various embodiments.

In some embodiments one or more environmental control material(s) may be contained within a packet such as, for example, packet 101 shown in FIG. 1C. In some embodiments, the environmental control material may be packaged in water-vapor permeable material such as porous paper or cloth surrounding an environmental control material. The packaging material and the environmental control material may be selected to reduce or avoid off-gassing or particle generation affecting wafers within the wafer carrier. In other embodiments, a solid piece of the environmental control material may be used in place of environmental control material.

Baseplate 106 forms a portion of environmental control material holder 102. Baseplate 106 may have a generally planar structure. Channel 110 may be formed in baseplate 106 at a position corresponding to one of the handle supports 126 included in handle 104. In an embodiment, a channel 110 may be provided for each of the handle supports 126 included in handle 104. In an embodiment, a channel 110 may be provided for each of the handle supports 126 that are between the outermost handle supports 126. Baseplate 106 may have a flat surface on a side opposite the environmental control material storage spaces 118. Baseplate 106 may be configured to be slidable along outer surface 124 of wafer cassette 100. In an embodiment, baseplate 106 may include a compatible material for contact with the wafer cassette 100. The compatible material may be a suitable polymer material selected for reduced particle generation when contacting the material of wafer cassette 100. In an embodiment, the compatible material is a material selected from a polyolefin, a polyether ether ketone (PEEK), a perfluoroalkoxy alkane (PFA), or any other suitable melt-processable polymers, and combinations thereof. In an embodiment, the compatible material is polypropylene. In an embodiment, the entire environmental control material holder 102 may be made of the compatible material. In an embodiment, environmental control material holder 102 may be formed as a single piece. In an embodiment, environmental control material holder 102 may be formed by, for example by one or more of injection molding, three-dimensional printing, machining, thermal forming, stamping, or any other suitable manufacturing methods.

Tabs 108 extend from away from baseplate 106 and as they extend, the tabs 108 curve towards the baseplate 106, such that each of the tabs 108 presents a surface opposite a surface of the baseplate 106. In an embodiment, the curve is an acute angle. In an embodiment, the curve of tabs 108 towards baseplate 108 is a right angle. The surface of tab 108 facing baseplate 106 and the opposite surface of the baseplate 106 may be spaced apart, defining an environmental control material storage space 118 between each of the tabs 108 and the corresponding portion of the baseplate 106. When inserting environmental control material holder 102 into handle 104 of wafer cassette 100, the tabs 108 are positioned away from outer surface 124 of the wafer cassette 100, and positioned outwards such that they are close to crossbar 128 of the handle 104.

Channel 110 is an opening formed in baseplate 106. Channel 110 may be positioned such that its position accommodates a handle support 126 of handle 104 while the environmental control material holder 102 is inserted into the handle 104. Channel 110 may have a width greater than a thickness of handle support 126. Channel 110 may run a portion of a longitudinal direction of the baseplate 106, such that a portion of baseplate 106 connects the portions of the baseplate 106 that are on either side of channel 110. Channel 110 may divide the baseplate 106 on a side of the baseplate where tabs 108 extend from and curve back towards the baseplate 106. The side of baseplate 106 divided by channel 110 may be an insertion end that is inserted into the handle 104 when the environmental control material holder 102 is combined with the handle 104.

Retaining features 112 are provided on tabs 108. In an embodiment, retaining features 112 may be provided on all of the tabs 108 of an environmental control material holder 102. In an embodiment, retaining features 112 may be provided on only one or some of the tabs 108 of an environmental control material holder. The retaining features 112 are configured to allow the environmental control material holder 102 to be inserted into handle 104 and to secure the environmental control material holder 102 to handle 104 once it has been inserted. The retaining features may engage the crossbar 128 of handle 104.

Retaining features 112 each include a ramped surface 114. The ramped surfaces 114 are configured to contact the handle 104 when the environmental control material holder 102 is inserted into the handle 104. The ramped surfaces 114 may come into contact with the handle 104 at crossbar 128. Contact of the ramped surfaces 114 with the handle 104 depresses the ramped surfaces 114 and flexes the retaining features 112 such that the tabs 108 can pass the handle 104 when the environmental control material holder 102 is inserted into the handle 104.

Retaining features 112 each include engagement surface 116. The engagement surface 116 is configured to contact the handle 104 such that the environmental control material holder 102 is held in place by the contact between the engagement surface 116 and the handle 104. Engagement surfaces 116 may be moved out of contact with handle 104 by depressing the ramped surfaces 114, for example by hand or using a tool. When ramped surfaces 114 are depressed and thus engagement surfaces 116 are out of contact with handle 104, environmental control material holder 102 may be removed from handle 104. Removing the environmental control material holder 102 from handle 104 may allow, for example, replacement of environmental control materials, or allow the use of handle 104 to carry or otherwise manipulate wafer cassette 100.

Environmental control material storage spaces 118 are defined by each of the tabs 108 and the portion of baseplate 106 opposing that tab 108. Each of the environmental control material storage spaces 118 is a space large enough to accommodate one or more of the environmental control materials or packets such as, for example, packet 101, containing one or more environmental control materials. The environmental control materials or environmental control material packet(s) are contained within the environmental control material storage spaces 118. In some embodiments, the environmental control materials or environmental control material packet(s) are clamped in the storage spaces 118 by being contacted by the opposing surfaces of baseplate 106 and one or more tabs 108.

Environmental control material retention tabs 120 may extend from one or both of the baseplate 106 and tabs 108 to further define the environmental control material storage spaces 118. Environmental control material retention tabs 120 may extend in a direction perpendicular to the plane of baseplate 106. Environmental control material retention tabs 120 may be formed at or near the perimeter of each of the tabs 108. Environmental control material retention tabs 120 may be formed at or near the perimeter of a portion of baseplate 106 that is opposed by one of the tabs 108. Environmental control material retention tabs 120 may extend to a height that is less than or equal to a distance between baseplate 106 and tab 108.

FIG. 1B shows the environmental control material holder 102 in an unfolded state. Environmental control material holder 102 includes baseplate 106 and tabs 108. Channel 110 is formed in baseplate 106 between tabs 108. Each of tabs 108 includes a retaining feature 112 configured to form a snap-fit with handle 104 of wafer cassette 100. Each retaining feature 112 can include a ramped surface 114 configured to allow insertion of environmental control material holder 102 into the handle 104 and an engagement surface 116 configured to retain environmental control material holder 102 in place by way of contact with handle 104. Tabs 108 and the baseplate 106 combine to define environmental control material storage spaces 118 between them, when environmental control material holder 102 is in a folded state. The environmental control material storage spaces 118 can be further defined by environmental control material retention tabs 120 extending from one of baseplate 106 as shown in FIG. 1A, or extending from tabs 108.

As shown in FIG. 1B, environmental control material holder 102 includes hinges 138 joining each of the tabs 108 to the baseplate 106. The hinges include a plurality of flexible regions 134 and at least one rigid region 136 between two of the flexible regions 134. The flexible regions 134 may be, for example, regions having a comparatively reduced thickness compared to the thickness of baseplate 106, tabs 108, or rigid region 136. The tabs 108 may be bent around hinge 138, such that faces 140 of the tabs 108 oppose the faces 142 of the baseplate 106. Environmental control material holder 102 can be fixed in this bent position by, for example, thermoforming, mechanical retention features included in the environmental control material holder, or external retention such as, for example, insertion of the environmental control material holder 102 into a wafer cassette 100 at the handle 104.

Environmental control material holder 102 can include one or more wafer cassette contacts 144. The wafer cassette contacts project from the baseplate 106 on a side opposing the face 142 of baseplate 106, such that when the environmental control material holder 102 is inserted into wafer cassette 100 at handle 104, the wafer cassette contacts 142 contact outer surface 124 of the wafer cassette 100. The wafer cassette contacts 142 can be flexible members. The wafer cassette contacts can provide a mechanical fit further retaining environmental control material holder 102 between handle 104 and the outer surface 124 of the wafer cassette 100.

Figure 2A:
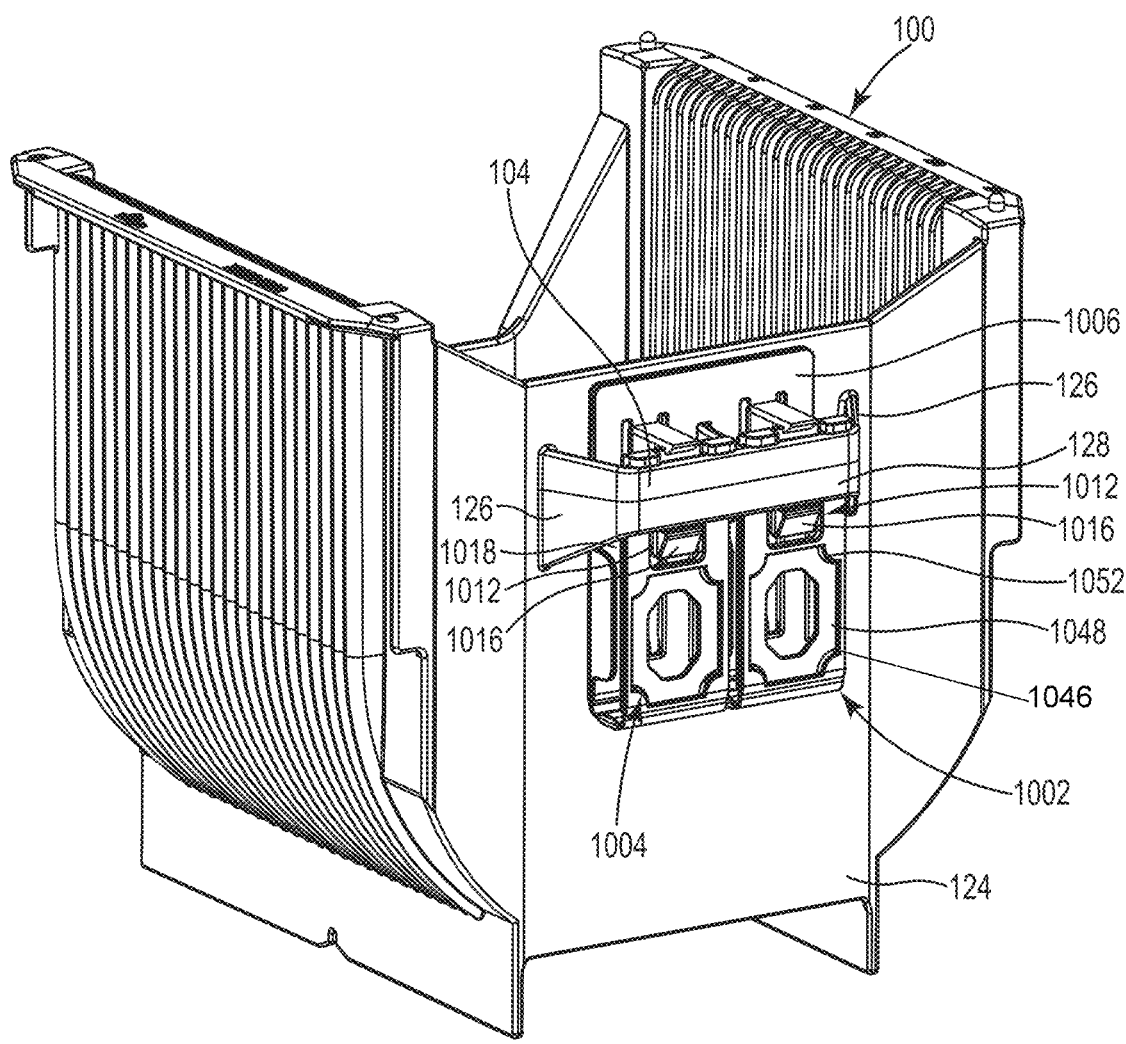
FIG. 2A shows a wafer cassette including environmental control holder according to another embodiment of the disclosure.
Figure 2B:
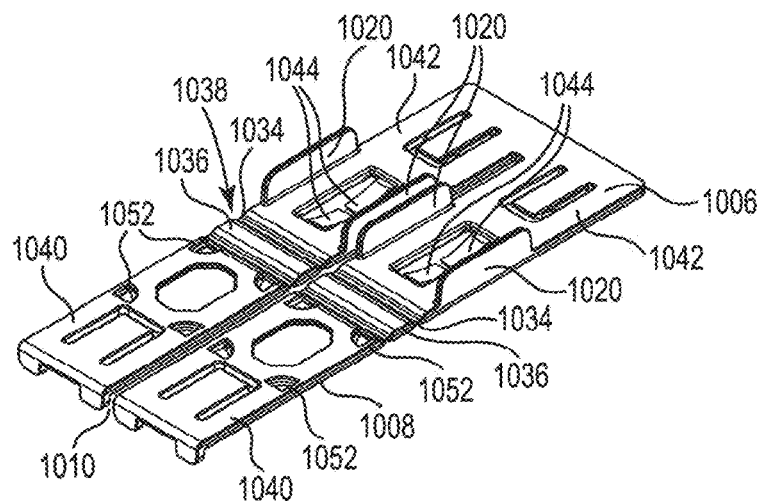
FIGS. 2B-2D show various views of the environmental control holder shown in FIG. 2A.
Figure 2C:
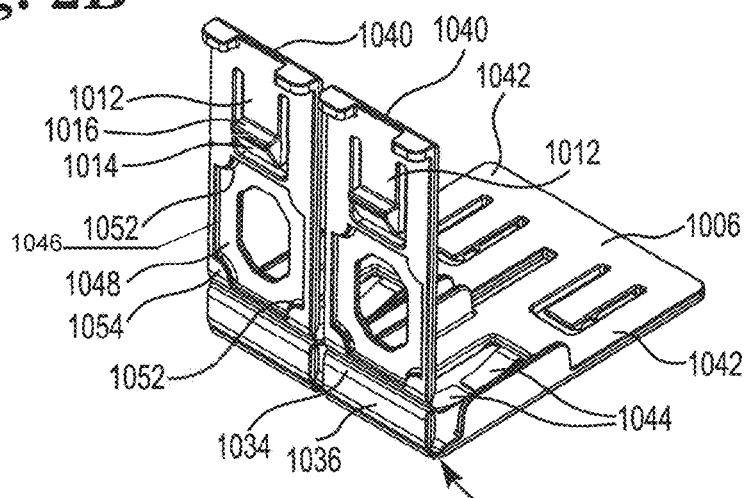
Figure 2D:
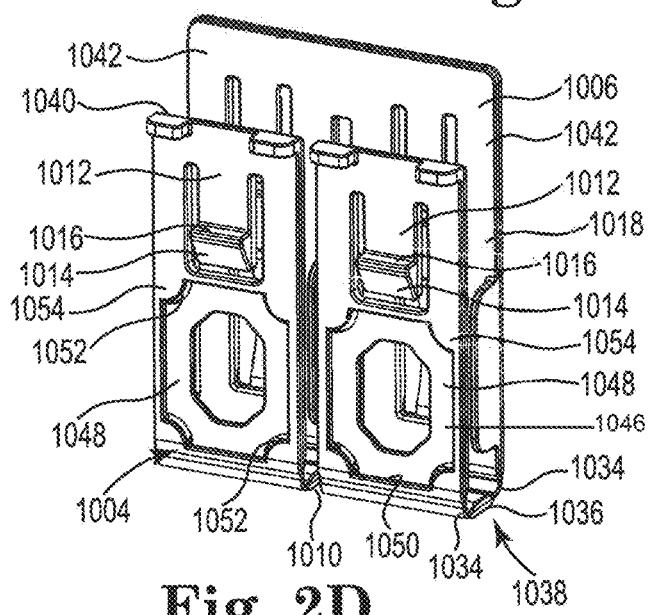

FIG. 2A shows wafer cassette 100 including an environmental control material holder 1002 provided in accordance with another embodiment of the disclosure. Wafer cassette 100 is described in detail above with reference to FIG. 1A. FIGS. 2B-2D show various views of environmental control holder 1002.

Figure 2E:
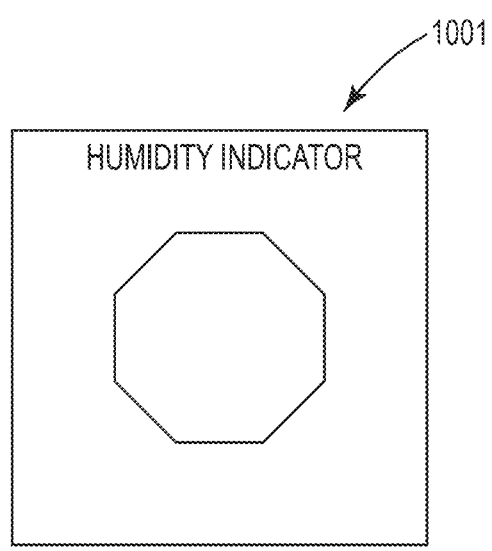
FIG. 2E shows an exemplary humidity indicator card that can be retained by the environmental control holder of FIGS. 2A-2D.

As shown in FIG. 2A, environmental control material holder 1002 is secured to wafer cassette 100 at handle 104. Environmental control material holder 1002 is configured to hold an environmental control material (not shown) such as, but not limited to, one or more packets containing environmental control materials. Additionally, environmental control material holder 1002 includes a window 1004 configured to hold a humidity indicator card such as, for example, humidity indicator card 1001 shown in FIG. 2E.

Environmental control material holder 1002 includes baseplate 1006 and tabs 1008. Channel 1010 is formed in baseplate 1006 between tabs 1008. Each of tabs 1008 includes a retaining feature 1012 configured to form a snap-fit with handle 104 of wafer cassette 100. Each retaining feature 1012 may include a ramped surface 1014 configured to allow insertion of environmental control material holder 102 into the handle 104 and an engagement surface 1016 configured to retain environmental control material holder 1002 in place by way of contact with handle 104. Tabs 1008 and the baseplate 1006 combine to define environmental control material storage spaces 1018 between them. The environmental control material storage spaces 1018 are further defined by environmental control material retention tabs 1020 extending from one of baseplate 1006 as shown in FIGS. 2A, and 2D or extending from tabs 1008.

Window 1004 includes an aperture 1046 defined in an outer surface 1054 of tabs 1008 and a recessed back plate 1048. Aperture 1046 can be appropriately shaped and sized to receive a humidity indicator card therein. As shown in FIGS. 2A and 2C-2D, aperture 1046 is generally rectangular. A humidity indicator card can be retained by one or more card retention features 1052 defined in an outer surface 1054 of tabs 1008, as show in FIG. 2B. The card retention features 1052 can include tabs defined in the outer surface of tabs 1008. Together, the tabs and recessed back plate 1048 cooperate to define slots between an upper surface of the recessed back plate and a lower surface of the tabs. The slots are configured to receive and retain a peripheral edge or corner of a humidity indicator card such as, for example, humidity indicator card 1001 shown in FIG. 2E. Exemplary humidity indicator cards are adapted to turn different colors or different shades of color associated with different humidity levels. When retained by the card retention features 1052, the humidity indicator card is viewable in window 1004. Aperture 1046 can be appropriately shaped and sized to receive a humidity indicator card therein. As shown in FIGS. 2A and 2C-2D, aperture 1046 is circular.

Baseplate 1006 may have a generally planar structure. Baseplate 1006 may have a flat surface on a side opposite the environmental control material storage spaces 1018. Baseplate 1006 may be configured to be slidable along outer surface 124 of wafer cassette 100. In an embodiment, baseplate 1006 can be composed of a compatible material for contact with the wafer cassette 100. The compatible material may be a suitable polymer material selected for reduced particle generation when contacting the material of wafer cassette 100. In an embodiment, the compatible material is a material selected from a polyolefin, a polyether ether ketone (PEEK), a perfluoroalkoxy alkane (PFA), or any other suitable melt-processable polymers, and combinations thereof. In an embodiment, the compatible material is polypropylene. In an embodiment, the entire environmental control material holder 1002 may be made of the compatible material. In an embodiment, environmental control material holder 1002 may be formed as a single piece. In an embodiment, environmental control material holder 1002 may be formed by, for example by one or more of injection molding, three-dimensional printing, machining, thermal forming, stamping, or any other suitable manufacturing methods.

Tabs 1008 extend from away from baseplate 1006 and as they extend, the tabs 1008 are configured to fold or curve back towards the baseplate 1006, such that each of the tabs 1008 presents a surface opposite a surface of the baseplate 1006 when the baseplate 1006 is in a folded or closed state. In an embodiment, the fold or curve is an acute angle. In an embodiment, the curve or fold of tabs 1008 towards baseplate 1006 is a right angle. In a folded or close state, as shown in FIGS. 2A and 2D, the surface of tabs 1008 facing baseplate 1006 and the opposite surface of the baseplate 1006 may be spaced apart, defining an environmental control material storage space 1018 between each of the tabs 1008 and the corresponding portion of the baseplate 1006. When inserting environmental control material holder 1002 into handle 104 of wafer cassette 100, the tabs 1008 are positioned away from outer surface 124 of the wafer cassette 100, and positioned outwards such that they are close to crossbar 128 of the handle 104.

Channel 1010 is an opening formed in baseplate 1006. Channel 1010 may be formed in baseplate 1006 at a position corresponding to one of the handle supports 126 included in handle 104. In an embodiment, a channel 1010 may be provided for each of the handle supports 126 that are between the outermost handle supports 126. Channel 1010 may be positioned such that its position accommodates a handle support 126 of handle 104 while the environmental control material holder 1002 is inserted into the handle 104. Channel 1010 may have a width greater than a thickness of handle support 126. Channel 1010 may run a portion of a longitudinal direction of the baseplate 1006, such that a portion of baseplate 1006 connects the portions of the baseplate 1006 that are on either side of channel 1010. Channel 1010 may divide the baseplate 1006 on a side of the baseplate where tabs 1008 extend from and curve back towards the baseplate 1006. The side of baseplate 1006 divided by channel 1010 may be an insertion end that is inserted into the handle 104 when the environmental control material holder 1002 is combined with the handle 104.

Retaining features 1012 are provided on tabs 1008. In an embodiment, retaining features 1012 may be provided on all of the tabs 1008 of an environmental control material holder 1002 as shown in FIGS. 2A-2D. In another embodiment, retaining features 1012 may be provided on only one or some of the tabs 1008 of an environmental control material holder. The retaining features 1012 are configured to allow the environmental control material holder 1002 to be inserted into handle 104 and to secure the environmental control material holder 102 to handle 104 once it has been inserted. The retaining features 1012 may engage the crossbar 128 of handle 104. In some embodiments, the retaining features 1012 are configured to form a snap-fit with handle 104 of wafer cassette 100.

Each retaining feature 1012 can include a ramped surface 1014 configured to allow insertion of environmental control material holder 1002 into the handle 104 and an engagement surface 1016 configured to retain environmental control material holder 102 in place by way of contact with handle 104. The ramped surfaces 1014 may come into contact with the handle 104 at crossbar 128. Contact of the ramped surfaces 1014 with the handle 104 depresses the ramped surfaces 1014 and flexes the retaining features 1012 such that the tabs 1008 can pass through the handle 104 when the environmental control material holder 1002 is inserted into the handle 104.

The engagement surface 1016 is configured to contact the handle 104 such that the environmental control material holder 1002 is held in place by the contact between the engagement surface 1016 and the handle 104. Engagement surfaces 1016 may be moved out of contact with handle 104 by depressing the ramped surfaces 1014, for example by hand or using a tool. When ramped surfaces 1014 are depressed and thus engagement surfaces 1016 are out of contact with handle 104, environmental control material holder 1002 may be removed from handle 104. Removing the environmental control material holder 1002 from handle 104 may allow, for example, replacement of any environmental control materials and/or humidity indicator card, or allow the use of handle 104 to carry or otherwise manipulate wafer cassette 100.

Environmental control material storage spaces 1018 are defined by each of the tabs 1008 and the portion of baseplate 1006 opposing that tab 1008 when the base plate is in the folded state such as shown in FIGS. 2A and 2D. Each of the environmental control material storage spaces 1018 is a space large enough to accommodate one or more of environmental control materials or packets containing one or more environmental control materials such as, for example, packet 101 shown in FIG. 1C. Exemplary environmental control materials are discussed in detail above with reference to FIGS. 1A-1C. The environmental control materials or environmental control material packet(s) are contained within the environmental control material storage spaces 1018. In some embodiments, the environmental control materials or environmental control material packet(s) are clamped in the storage spaces 1018 by being contacted by the opposing surfaces of baseplate 1006 and one or more tabs 1008.

Environmental control material retention tabs 1020 may extend from one or both of the baseplate 1006 and tabs 1008 to further define the environmental control material storage spaces 1018. Environmental control material retention tabs 1020 may extend in a direction perpendicular to the plane of baseplate 1006. Environmental control material retention tabs 1020 may be formed at or near the perimeter of each of the tabs 1008. Environmental control material retention tabs 1020 may be formed at or near the perimeter of a portion of baseplate 1006 that is opposed by one of the tabs 1008. Environmental control material retention tabs 1020 may extend to a height that is less than or equal to a distance between baseplate 1006 and tab 1008.

FIGS. 2B-2D show environmental control holder 1002 in an unfolded state, a partially folded state, and a folded state, respectively. As shown in FIGS. 2B-2D, environmental control material holder 1002 includes hinges 1038 joining each of the tabs 1008 to the baseplate 1006. The hinges include a plurality of flexible regions 1034 and at least one rigid region 1036 between two of the flexible regions 1034. The flexible regions 1034 may be, for example, regions having a comparatively reduced thickness compared to the thickness of baseplate 1006, tabs 1008, or rigid region 1036. The tabs 1008 may be bent around hinge 1038, such that faces 1040 of the tabs 1008 oppose the faces 1042 of the baseplate 1006. Environmental control material holder 1002 can be fixed in this bent position by, for example, thermoforming, mechanical retention features included in the environmental control material holder, or external retention such as, for example, insertion of the environmental control material holder 1002 into a wafer cassette 100 at the handle 104.

Environmental control material holder 1002 can include one or more wafer cassette contacts 1044. The wafer cassette contacts project from the baseplate 1006 on a side opposing the face 1042 of baseplate 1006, such that when the environmental control material holder 1002 is inserted into wafer cassette 100 at handle 104, the wafer cassette contacts 1042 contact outer surface 124 of the wafer cassette 100. The wafer cassette contacts 1044 can be flexible members. The wafer cassette contacts 1044 can provide a mechanical fit further retaining environmental control material holder 102 between handle 104 and the outer surface 124 of the wafer cassette 100.

Figure 3A:
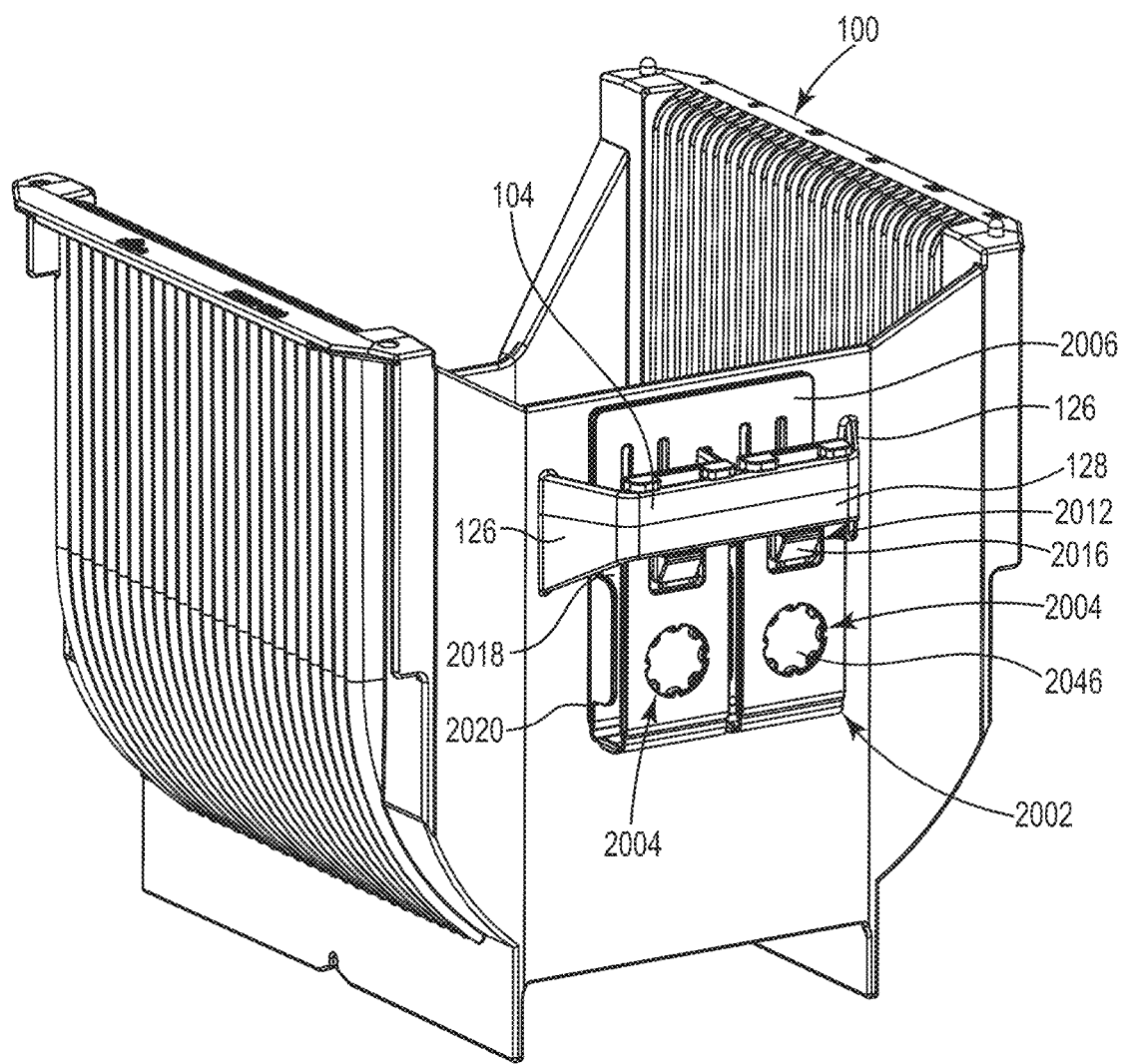
FIG. 3A shows a wafer cassette including environmental control holder according to another embodiment of the disclosure.

FIG. 3A shows wafer cassette 100 including an environmental control material holder 2002 provided in accordance with another embodiment of the disclosure. Wafer cassette 100 is described in detail above with reference to FIG. 1A. FIGS. 2B-2D show various views of environmental control holder 2002.

As shown in FIG. 3A, environmental control material holder 2002 is secured to wafer cassette 100 at handle 104. Environmental control material holder 2002 is configured to hold an environmental control material (not shown) such as, but not limited to, one or more packets containing environmental control materials. Additionally, environmental control material holder 2002 includes a window 2004 configured to hold a humidity indicator card such as, for example, humidity indicator card 2001 shown in FIG. 3E.

Environmental control material holder 2002 includes baseplate 2006 and tabs 2008. Channel 2010 is formed in baseplate 2006 between tabs 2008. Each of tabs 2008 includes a retaining feature 2012 configured to form a snap-fit with handle 104 of wafer cassette 100. Each retaining feature 2012 may include a ramped surface 2014 configured to allow insertion of environmental control material holder 102 into the handle 104 and an engagement surface 2016 configured to retain environmental control material holder 2002 in place by way of contact with handle 104. Tabs 2008 and the baseplate 2006 combine to define environmental control material storage spaces 2018 between them. The environmental control material storage spaces 2018 are further defined by environmental control material retention tabs 2020 extending from one of baseplate 2006 as shown in FIGS. 2A, and 2D or extending from tabs 2008.

Window 2004 includes an aperture 2046 defined in an outer surface 1054 of tabs 1008 and a recessed back plate 2046. Aperture 2046 can be appropriately shaped and sized to receive a humidity indicator card therein. As shown in FIGS. 3A and 3C-3D, aperture 2046 is circular. A humidity indicator card can be retained by one or more card retention features 1052 defined in an outer surface 1054 of tabs 1008, as show in FIG. 2B. The card retention features 1052 can include one or more tabs defined in the outer surface of tabs 1008. Together, the tabs and recessed back plate 1048 cooperate to define slots between an upper surface of the recessed back plate 1048 and a lower surface of the tabs. The slots are configured to receive and retain a peripheral edge of a humidity indicator card such as, for example, humidity indicator card 2001 shown in FIG. 3E. Exemplary humidity indicator cards are adapted to turn different colors or different shades of color associated with different humidity levels. When retained by the card retention features 1052, the humidity indicator card is viewable in window 1004.

Baseplate 2006 may have a generally planar structure. Baseplate 2006 may have a flat surface on a side opposite the environmental control material storage spaces 2018. Baseplate 2006 may be configured to be slidable along outer surface 124 of wafer cassette 100. In an embodiment, baseplate 2006 can be composed of a compatible material for contact with the wafer cassette 100. The compatible material may be a suitable polymer material selected for reduced particle generation when contacting the material of wafer cassette 100. In an embodiment, the compatible material is a material selected from a polyolefin, a polyether ether ketone (PEEK), a perfluoroalkoxy alkane (PFA), or any other suitable melt-processable polymers, and combinations thereof. In an embodiment, the compatible material is polypropylene. In an embodiment, the entire environmental control material holder 2002 may be made of the compatible material. In an embodiment, environmental control material holder 2002 may be formed as a single piece. In an embodiment, environmental control material holder 2002 may be formed by, for example by one or more of injection molding, three-dimensional printing, machining, thermal forming, stamping, or any other suitable manufacturing methods.

Tabs 2008 extend from away from baseplate 2006 and as they extend, the tabs 2008 are configured to fold or curve back towards the baseplate 2006, such that each of the tabs 2008 presents a surface opposite a surface of the baseplate 206 when the baseplate 2006 is in a folded or closed state. In an embodiment, the fold or curve is an acute angle. In an embodiment, the curve or fold of tabs 2008 towards baseplate 2006 is a right angle. In a folded or close state, as shown in FIGS. 2A and 2D, the surface of tabs 2008 facing baseplate 2006 and the opposite surface of the baseplate 2006 may be spaced apart, defining an environmental control material storage space 2018 between each of the tabs 2008 and the corresponding portion of the baseplate 2006. When inserting environmental control material holder 2002 into handle 104 of wafer cassette 100, the tabs 2008 are positioned away from outer surface 124 of the wafer cassette 100, and positioned outwards such that they are close to crossbar 128 of the handle 104.

Channel 2010 is an opening formed in baseplate 2006. Channel 2010 may be formed in baseplate 2006 at a position corresponding to one of the handle supports 126 included in handle 104. In an embodiment, a channel 2010 may be provided for each of the handle supports 126 that are between the outermost handle supports 126. Channel 2010 may be positioned such that its position accommodates a handle support 126 of handle 104 while the environmental control material holder 2002 is inserted into the handle 104. Channel 2010 may have a width greater than a thickness of handle support 126. Channel 2010 may run a portion of a longitudinal direction of the baseplate 2006, such that a portion of baseplate 2006 connects the portions of the baseplate 2006 that are on either side of channel 2010. Channel 2010 may divide the baseplate 2006 on a side of the baseplate where tabs 2008 extend from and curve back towards the baseplate 2006. The side of baseplate 2006 divided by channel 2010 may be an insertion end that is inserted into the handle 104 when the environmental control material holder 2002 is combined with the handle 104.

Retaining features 2012 are provided on tabs 2008. In an embodiment, retaining features 2012 may be provided on all of the tabs 2008 of an environmental control material holder 2002 as shown in FIGS. 3A-3D. In another embodiment, retaining features 2012 may be provided on only one or some of the tabs 2008 of an environmental control material holder. The retaining features 2012 are configured to allow the environmental control material holder 2002 to be inserted into handle 104 and to secure the environmental control material holder 102 to handle 104 once it has been inserted. The retaining features 2012 may engage the crossbar 128 of handle 104. In some embodiments, the retaining features 2012 are configured to form a snap-fit with handle 104 of wafer cassette 100.

Each retaining feature 2012 can include a ramped surface 2014 configured to allow insertion of environmental control material holder 2002 into the handle 104 and an engagement surface 2016 configured to retain environmental control material holder 102 in place by way of contact with handle 104. The ramped surfaces 2014 may come into contact with the handle 104 at crossbar 128. Contact of the ramped surfaces 2014 with the handle 104 depresses the ramped surfaces 2014 and flexes the retaining features 2012 such that the tabs 2008 can pass through the handle 104 when the environmental control material holder 2002 is inserted into the handle 104.

The engagement surface 2016 is configured to contact the handle 104 such that the environmental control material holder 2002 is held in place by the contact between the engagement surface 2016 and the handle 104. Engagement surfaces 2016 may be moved out of contact with handle 104 by depressing the ramped surfaces 2014, for example by hand or using a tool. When ramped surfaces 2014 are depressed and thus engagement surfaces 2016 are out of contact with handle 104, environmental control material holder 2002 may be removed from handle 104. Removing the environmental control material holder 2002 from handle 104 may allow, for example, replacement of any environmental control materials and/or humidity indicator card, or allow the use of handle 104 to carry or otherwise manipulate wafer cassette 100.

Environmental control material storage spaces 2018 are defined by each of the tabs 2008 and the portion of baseplate 2006 opposing that tab 2008 when the base plate is in the folded state such as shown in FIGS. 3A and 3D. Each of the environmental control material storage spaces 2018 is a space large enough to accommodate one or more of environmental control materials or packets containing one or more environmental control materials such as, for example, packet 101 shown in FIG. 1C. Exemplary environmental control materials are discussed in detail above with reference to FIGS. 1A-1C. The environmental control materials or environmental control material packet(s) are contained within the environmental control material storage spaces 2018. In some embodiments, the environmental control materials or environmental control material packet(s) are clamped in the storage spaces 2018 by being contacted by the opposing surfaces of baseplate 2006 and one or more tabs 2008.

Environmental control material retention tabs 2020 may extend from one or both of the baseplate 2006 and tabs 2008 to further define the environmental control material storage spaces 2018. Environmental control material retention tabs 2020 may extend in a direction perpendicular to the plane of baseplate 2006. Environmental control material retention tabs 2020 may be formed at or near the perimeter of each of the tabs 2008. Environmental control material retention tabs 2020 may be formed at or near the perimeter of a portion of baseplate 2006 that is opposed by one of the tabs 2008. Environmental control material retention tabs 2020 may extend to a height that is less than or equal to a distance between baseplate 2006 and tab 2008.

Figure 3B:
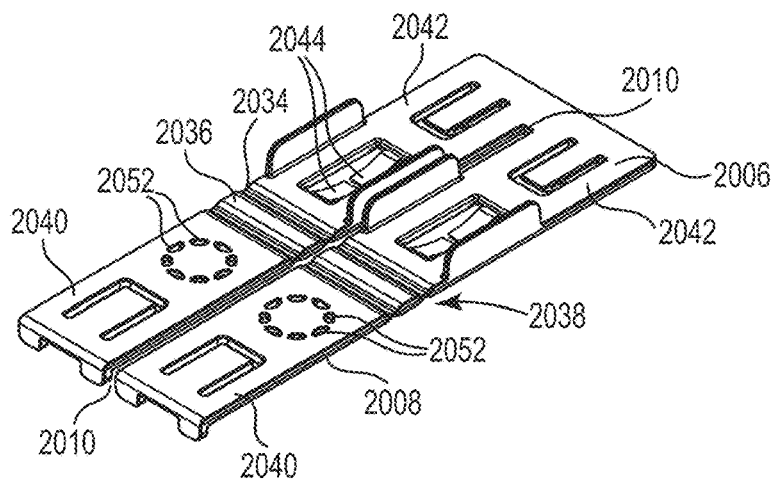
FIGS. 3B-3D show various views of the environmental control holder shown in FIG. 3A.
Figure 3C:
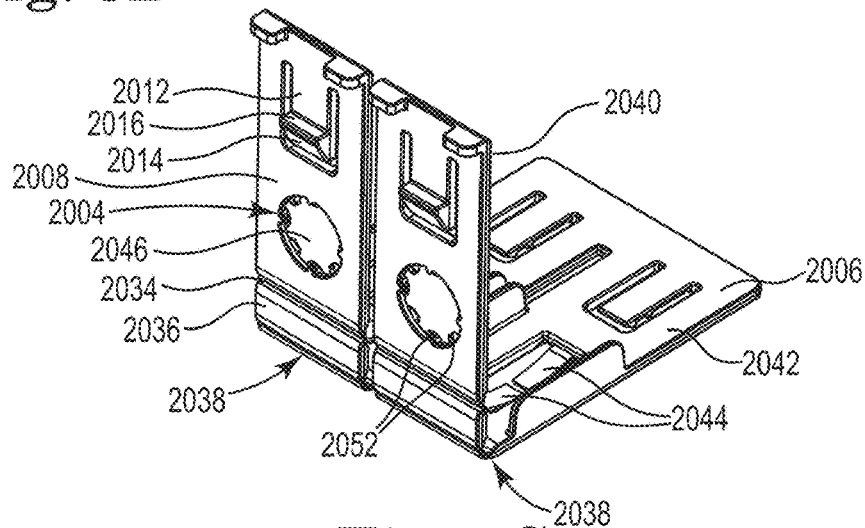
Figure 3D:
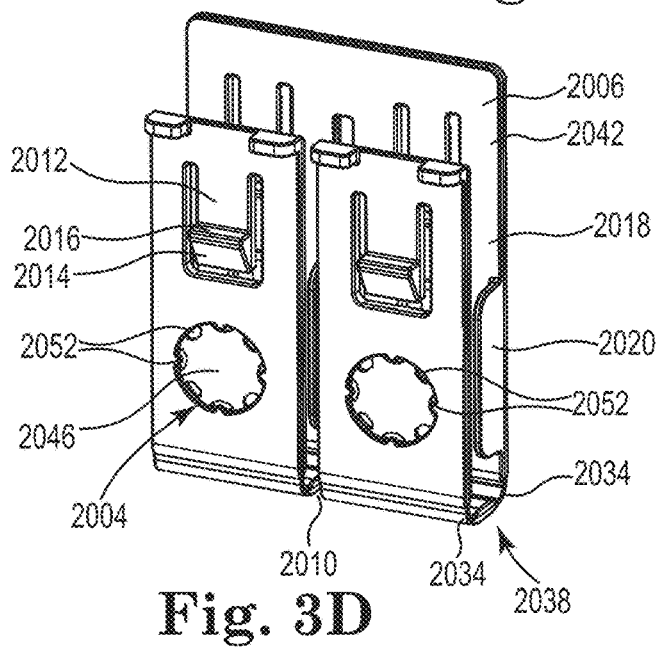
Figure 3E:
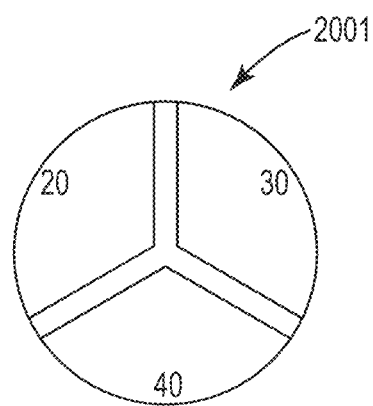
FIG. 3E shows an exemplary humidity indicator card that can be retained by the environmental control holder of FIGS. 3A-3D.

FIGS. 3B-3D show environmental control holder 2002 in an unfolded state, a partially folded state, and a folded state, respectively. As shown in FIGS. 3B-3D, environmental control material holder 2002 includes hinges 2038 joining each of the tabs 2008 to the baseplate 2006. The hinges include a plurality of flexible regions 2034 and at least one rigid region 2036 between two of the flexible regions 2034. The flexible regions 2034 may be, for example, regions having a comparatively reduced thickness compared to the thickness of baseplate 2006, tabs 2008, or rigid region 2036. The tabs 2008 may be bent around hinge 2038, such that faces 2040 of the tabs 2008 oppose the faces 2042 of the baseplate 1006. Environmental control material holder 2002 can be fixed in this bent position by, for example, thermoforming, mechanical retention features included in the environmental control material holder, or external retention such as, for example, insertion of the environmental control material holder 2002 into a wafer cassette 100 at the handle 104.

Environmental control material holder 2002 can include one or more wafer cassette contacts 2044. The wafer cassette contacts project from the baseplate 2006 on a side opposing the face 2042 of baseplate 2006, such that when the environmental control material holder 2002 is inserted into wafer cassette 100 at handle 104, the wafer cassette contacts 2042 contact outer surface 124 of the wafer cassette 100. The wafer cassette contacts 2044 can be flexible members. The wafer cassette contacts can provide a mechanical fit further retaining environmental control material holder 102 between handle 104 and the outer surface 124 of the wafer cassette 100.

The embodiments described above relate to an environmental control material holder engaged with a handle of a wafer cassette. An environmental control material holder can be engaged with other regions or portion of a wafer cassette for controlling environmental conditions within a wafer carrier, as described herein.

Figure 4A:
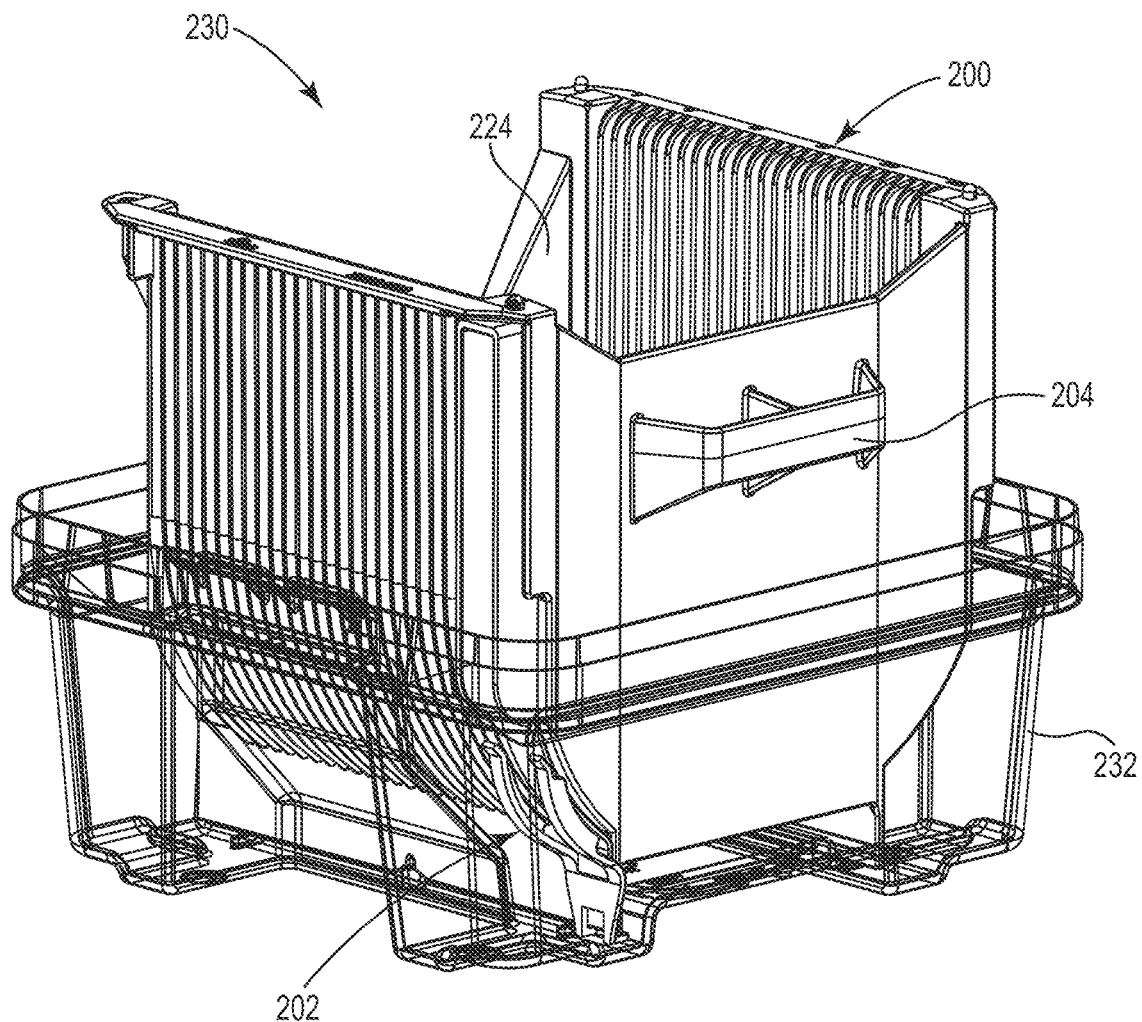
FIG. 4A shows a wafer carrier including a wafer cassette and environmental control holder according to another embodiment of the disclosure
Figure 4B:
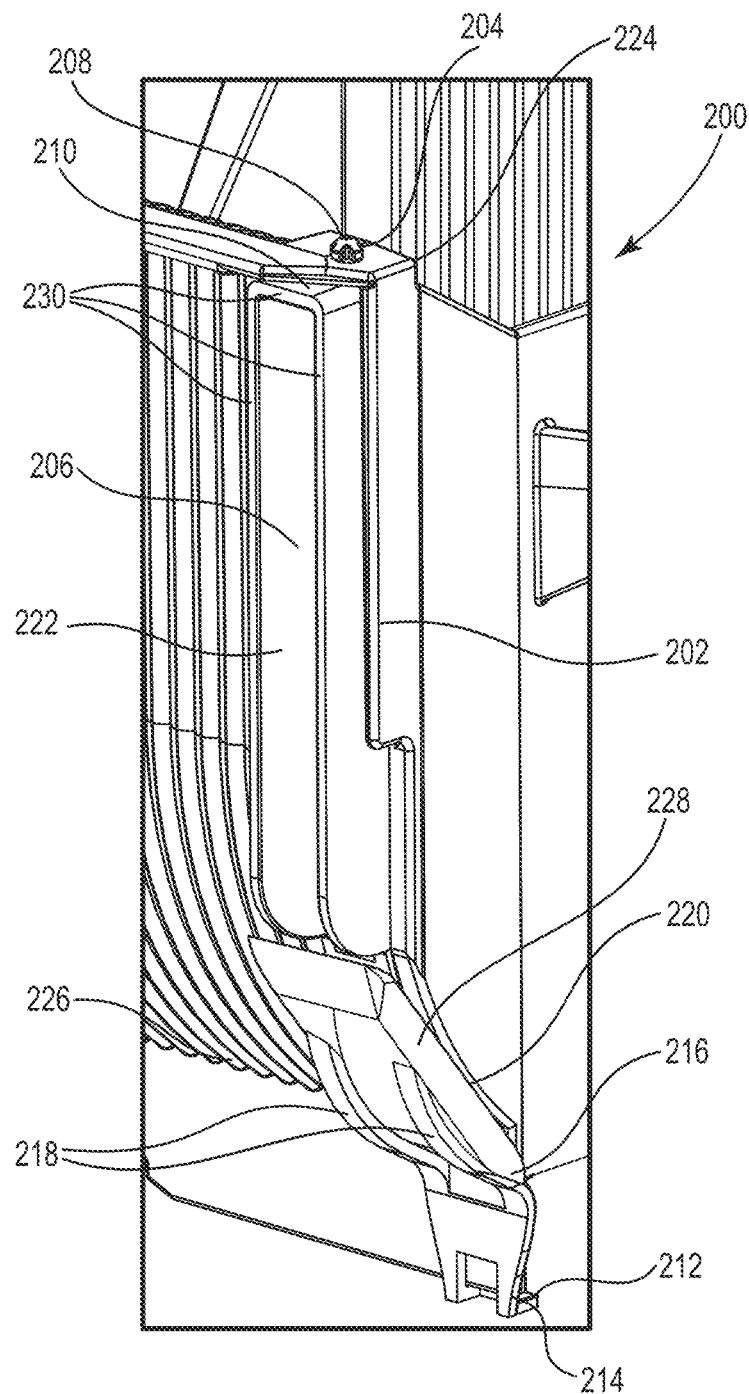
FIG. 4B is a close-up view of a portion of the wafer cassette shown in FIG. 4A including an attached environmental control material holder in accordance with an embodiment of the disclosure.
Figure 4C:
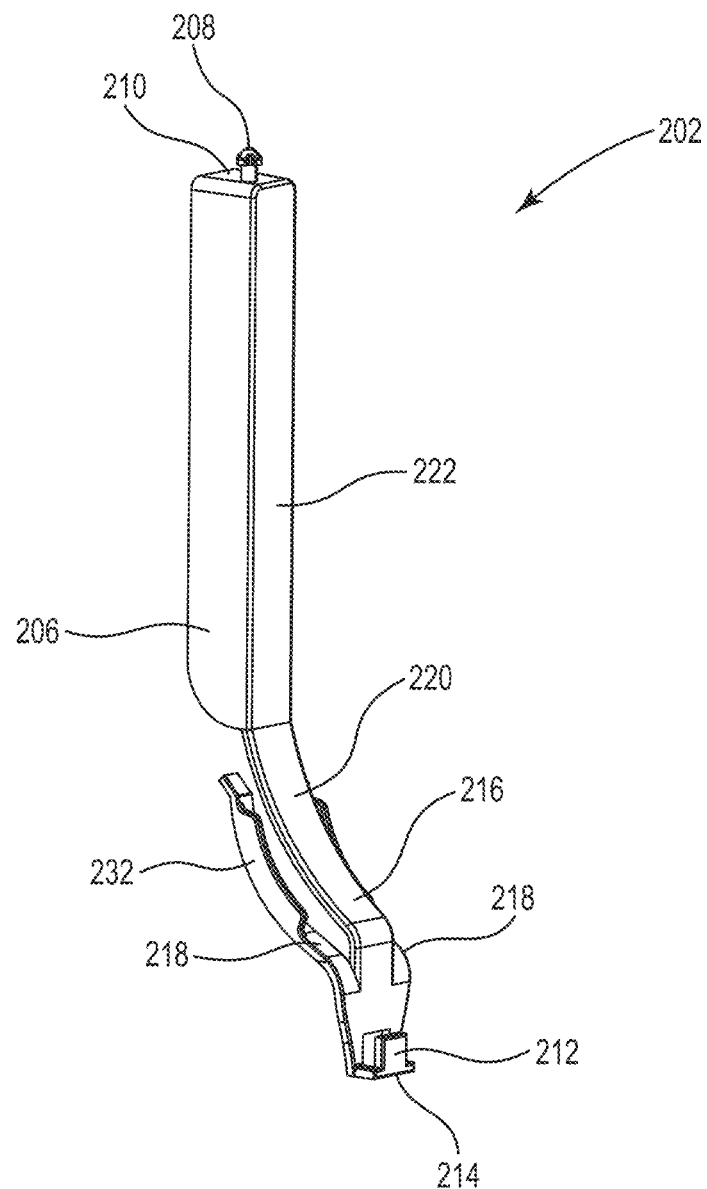
FIG. 4C shows the environmental control material holder of FIG. 4B.

FIG. 4A shows a wafer carrier 230 including a wafer cassette 200 and environmental control material holder 202 provided in accordance with another embodiment of the disclosure. Wafer cassette 200 is shown received in an outer shell 232 of wafer carrier 230. FIG. 4B shows is a close up view of a portion of a wafer cassette 200 including environmental control material holder 202 coupled thereto. FIG. 4C shows the environmental control material holder 202 when detached from wafer cassette 200. The portion of wafer cassette 200 shown in FIG. 4B is the full height of wafer cassette 200 at a corner of the wafer cassette 200.

Wafer cassette 200 has many of the same features as wafer cassette 100 described herein with reference to FIG. 1A. Additionally, in some embodiments, wafer cassette 200 can include an aperture 204 located at or near a corner of an open end 224 of the wafer cassette 200. Aperture 204 may be, for example, a hole, a notch, or a recess formed in the wafer cassette 200. Environmental control material holder 202 may be sized such that it can be accommodated in a gap between the wafer cassette 200 and the outer shell. Wafer cassette 200 may be any suitable wafer cassette, such as 25-wafer cassettes used with wafer carriers. Wafer cassette 200 may be made of a polymer material. In an embodiment, the polymer material is a polyolefin. In an embodiment, the polymer material is a material selected from high-density polyethylene (HDPE), polypropylene (PP), polyether ether ketone (PEEK), perfluoroalkoxy alkane (PFA), or any other suitable melt-processable polymers, and combinations thereof. In an embodiment, the polymer material is polypropylene.

Environmental control material holder 202 includes an environmental control material holder body 206, a pin 208 at a first end 210 of the environmental control material holder body 206, a securing feature 212 at a second end 214 of the environmental control material holder body 206, and an environmental control material retainer 216 disposed on the environmental control material holder body 206. The environmental control material retainer 216 includes one or more beams 218. The beams 218 may retain an environmental control material 228 against the environmental control material retainer 216.

Environmental control material holder body 206 extends along the wafer cassette 200 in a height direction of wafer cassette 200 (vertically with respect to the page). Environmental control material holder body 206 allows environmental control material holder 202 to be secured to wafer cassette 200 at two separate locations, spaced apart from one another, so that environmental control material retainer 216 can be fixed at a position relative to wafer cassette 200. In an embodiment, environmental control material holder body 206 may add rigidity to the wafer cassette 200 where it is installed.

The environmental control material holder body 206 may include a curved portion 220 and a straight portion 222. The curved portion 220 may correspond to a curved surface formed on an outer side surface 226 of the wafer cassette 200. The straight portion 222 may correspond to a flat surface formed on the outer side surface 226 of the wafer cassette 200. The straight portion 222 may include one or more ribs 230 extending outwards from the straight portion 222. The one or more ribs 230 may extend in directions longitudinal or transverse to the straight portion 222. The one or more ribs 230 may provide additional rigidity to the environmental control material holder 202.

Pin 208 may be located at a first end 210 of the environmental control material holder body 206. Pin 208 may be used to secure first end 210 of environmental control material holder body 206 to the wafer cassette 200. Pin 208 may be sized such that it can extend through aperture 204 in wafer cassette 200. In the embodiment shown in FIGS. 4B and 4C, pin 208 is located at an end of the straight portion 222 of the environmental control material holder body 206. Pin 208 may have a bulbous end sized such that it can be pressed through aperture 204, but resists passage through aperture 204 by friction or mechanical interference at lower applications of force.

Securing feature 212 may be located at a second end 214 of the environmental control material holder body 206. Second end 214 may be an end opposite first end 210 of the environmental control material holder body 206. Securing feature 212 can include, for example, a hook, a catch, or other such features suitable for securing second end 214 to the wafer cassette 200. Securing feature 212 is configured to engage a portion of wafer cassette 200 to retain environmental control material holder 202 along wafer cassette 200 when pin 208 is inserted into aperture 204. Securing feature 212 may have any suitable shape to engage the wafer cassette 200.

Environmental control material retainer 216 is included in environmental control material holder body 206. Environmental control material retainer 216 is configured to retain one or more environmental control materials 228. Environmental control material retainer 216 may include the curved portion 220 of the environmental control material holder body 206 and one or more beams 218. The one or more beams 218 are each flexible members extending from environmental control material retainer 216. Each of the one or more beams 218 is configured to at least partially clamp an environmental control material 228 to environmental control material retainer 216. A space between beams 218 and the rest of environmental control material retainer 216 may contain an environmental control material 228. When each of the beams 218 is in an unflexed state, a distance from the beam 218 to an opposing surface, such as the curved portion 220, is smaller than a thickness of the environmental control material 228, such that presence of an environmental control material 228 deflects the beam 218 and the beam 218 provides a spring force towards the opposing surface. In an embodiment, two or more beams 218 can be used for each environmental control material 228 that is to be retained in environmental control material retainer 216.

Environmental control material 228 includes an environmental control material that can absorb moisture from within the wafer carrier including environmental control material holder 202. Environmental control material 228 may be, for example, a package of water-vapor permeable material, such as porous paper or cloth surrounding an environmental control material. The packaging material and the environmental control material may be selected to reduce or avoid off-gassing or particle generation affecting wafers within the wafer carrier. The environmental control material may be, as non-limiting examples, silica gel, activated charcoal, calcium sulfate, calcium chlorite, zeolites, or any other suitable environmental control material. In an embodiment, a solid piece of the environmental control material may be used in place of environmental control material 228. In some embodiments, one or more environmental control materials 228 may be provided in a packet such as, for example, packet 101 as described herein with reference to FIG. 1C.

In an embodiment, environmental control material holder 202 may be formed as a single piece. In an embodiment, environmental control material holder 202 may be formed by, for example by one or more of injection molding, three-dimensional printing, machining, thermal forming, stamping, or any other suitable manufacturing methods. Environmental control material holder 202 may include a compatible material for contact with the wafer cassette 200. The compatible material may be a suitable polymer material selected for reduced particle generation when contacting the material of wafer cassette 200. In an embodiment, the compatible material is a polyolefin. In an embodiment, the compatible material is a material selected from polyolefins, polyether ether ketone (PEEK), perfluoroalkoxy alkane (PFA), or any other suitable melt-processable polymers, and combinations thereof. In an embodiment, the compatible material is polypropylene. In an embodiment, the entire environmental control material holder 202 may be made of the compatible material.

In FIG. 4C, retention tabs 232 are visible on the beams 218. The retention tabs 232 extend outwards from the beams 218. In an embodiment, the retention tabs 232 contact the environmental control material 228. In an embodiment, the retention tabs 232 partially define a space between beams 218 where the environmental control material 228 is located.

Figure 5A:
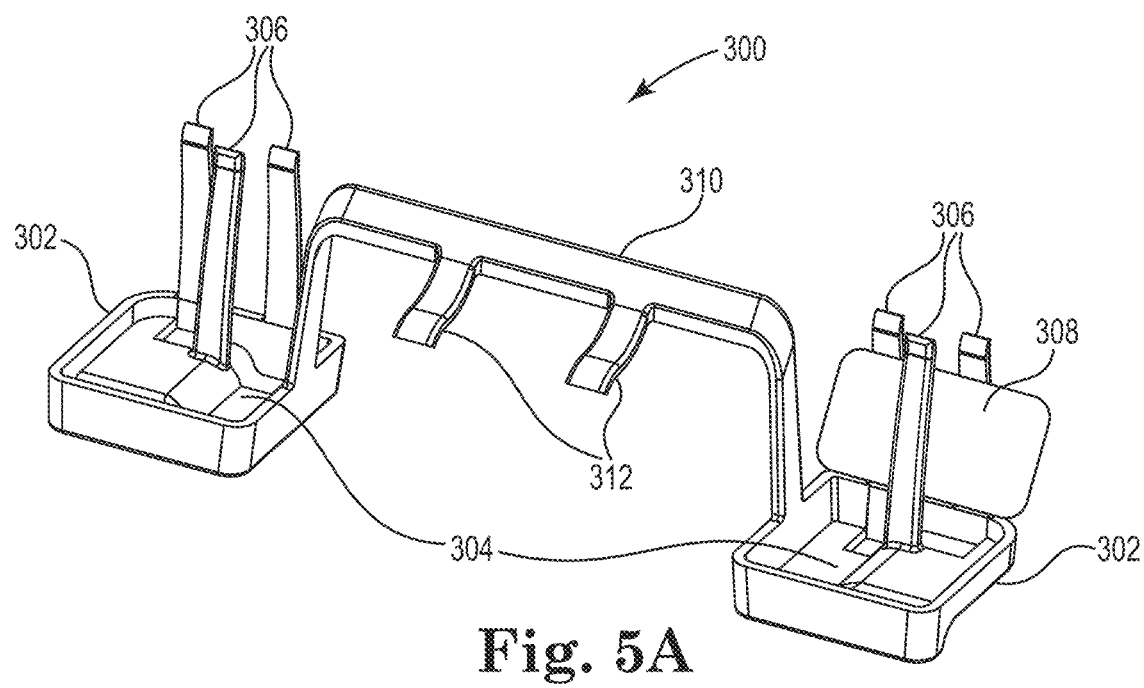
FIG. 5A shows an environmental control material holder provided in accordance with an embodiment of the disclosure.
Figure 5B:
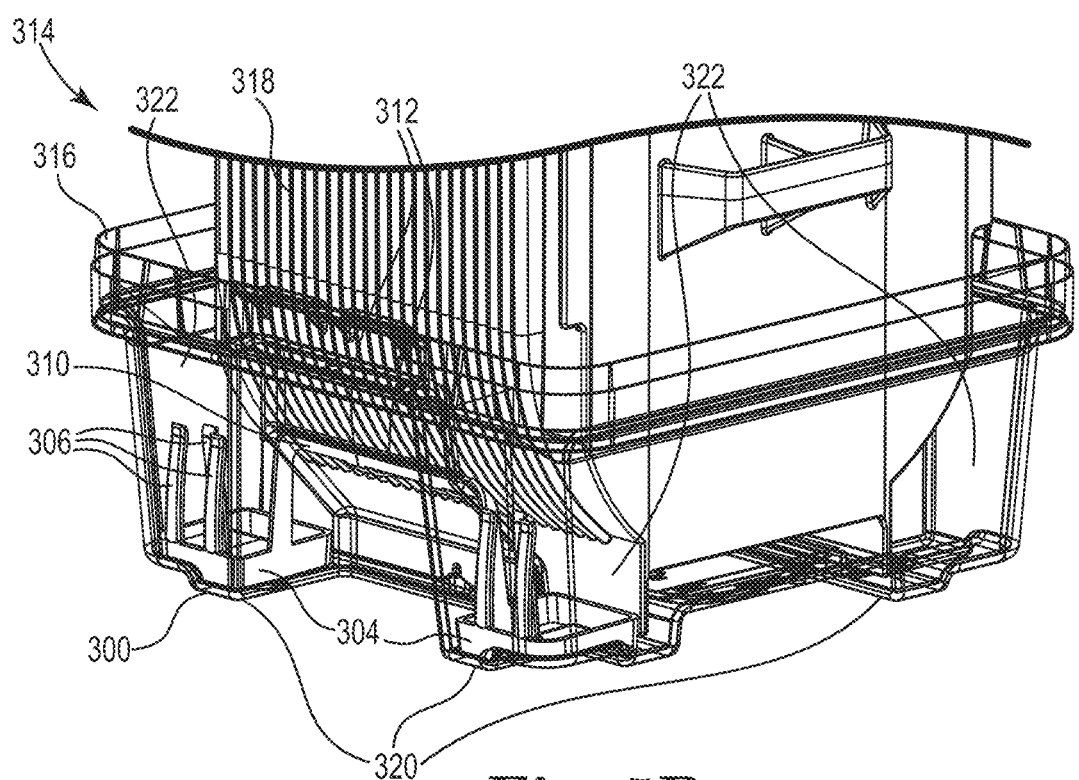
FIG. 5B shows the environmental control material holder of FIG. 5A installed into a wafer carrier.

FIGS. 5A and 5B show an environmental control material holder 300, according to an embodiment. Environmental control material holder 300 is configured to be used with a wafer carrier 314, shown in FIG. 5B. The wafer carrier 314 may include an outer shell 316, shown in FIG. 5B, and a wafer cassette 318, which is placed into the outer shell 316 when assembling the wafer carrier 314. The outer shell 316 has corners 320.

Environmental control material holder 300 includes two or more environmental control material retainers 302. Each of the environmental control material retainers 302 includes a base 304 and two or more beams 306. The two or more beams 306 of environmental control material retainer 302 are configured to hold an environmental control material 308 between them. The environmental control material retainers 302 are joined by arms 310, each of the arms 310 extending between two of the environmental control material retainers 302. Each of the arms 310 includes one or more spring arms 312.

Base 304 is a portion of environmental control material retainer 302 configured to interface with the outer shell 316, as shown in FIG. 5B. Base 304 may have a shape matching a corner 320 of the outer shell 316, such that the base 304 may be inserted into a recessed portion of that corner 320 of the outer shell 316. One or more beams 306 and one or more arms 310 may each extend from base 304.

Each of the environmental control material retainers 302 includes at least three beams 306. The beams 306 are flexible projections from base 304. The beams 306 are provided in two groups, with at least one of the groups including at least two beams 306. The two groups of beams 306 are configured such that one or more environmental control materials 308 may be secured between the groups of beams 306. The two groups of beams 306 may be positioned opposite one another. In an embodiment, beams 306 of each of the respective groups extend in directions having a component towards the other group. In an embodiment, a first group of beams 306 includes two beams 306 positioned apart from one another along a direction, and a second group of beams 306 includes one beam 306 positioned between the two beams 306 of the first group along that direction. The two groups of beams 306 may be configured to each provide opposing spring forces to clamp one or more environmental control materials 308 between the respective groups.

Environmental control material 308 includes an environmental control material that can absorb moisture from within the wafer carrier including environmental control material holder 300. Environmental control material 308 may be, for example, a packet of water-vapor permeable material, such as porous paper or cloth surrounding an environmental control material. The packaging material and the environmental control material may be selected to reduce or avoid off-gassing or particle generation affecting wafers within the wafer carrier. The environmental control material may be, as non-limiting examples, silica gel, activated charcoal, calcium sulfate, calcium chlorite, zeolites, or any other suitable environmental control material. In an embodiment, a solid piece of the environmental control material may be used in place of environmental control material 308. In some embodiments, one or more environmental control materials 308 may be provided in a packet such as, for example, packet 101 as described herein with reference to FIG. 1C.

Arms 310 join the environmental control material retainers 302. Each of the arms 310 joins two of the environmental control material retainers 302. Each of the arms 310 may be joined to the bases 304 of two separate environmental control material retainers 302. In an embodiment, environmental control material holder 300 includes two environmental control material retainers 302 joined by one arm 310. In an embodiment, environmental control material holder 300 includes three environmental control material retainers 302, joined by two arms 310. In this embodiment, one environmental control material retainer 302 has two arms extending from it to the other environmental control material retainers 302, and those other environmental control material retainers 302 are each connected to one arm 310. In an embodiment, environmental control material holder 300 includes four environmental control material retainers 302, joined by three arms 310. In this embodiment, two of the environmental control material retainers 302 each have two arms 310 joined to them, and two of the environmental control material retainers 302 each have one arm 310 joined to them.

One or more spring arms 312 extend from each of the arms 310. The spring arms 312 are each configured to be flexible. In an embodiment, one spring arm 312 is provided on each of the arms 310. In an embodiment, two spring arms 312 are provided on each of the arms 310. The spring arms 312 are configured to extend a distance towards the inside of the outer shell 316 of the wafer carrier such that when the wafer cassette 318 is installed into the outer shell 316, the spring arms 312 contact the wafer cassette 318. Contact between spring arms 312 and the wafer cassette 318 applies force to the environmental control material holder 300. The force provided by contact between spring arms 312 and the wafer cassette 318 has a component downwards towards a bottom of the outer shell 316, securing bases 302 of the environmental control material holder 300 within the outer shell 316, for example at corners 320.

As shown in FIG. 5B, environmental control material holder 300 may be installed into outer shell 316. When installed, bases 304 of the environmental control material holders 302 fit into corresponding portions in the bottom of the outer shell 316, for example at corners 320. When wafer cassette 318 is placed into outer shell 316, space 322 exists between the outer shell 316 and the wafer cassette 318. The arms 310 joining environmental control material retainers 302 of environmental control material holder 300 extend through space 322 when the environmental control material holder 300 and the wafer cassette 318 are placed within the outer shell 316. Each of the environmental control materials 308 are retained by beams 306 within space 322 when the environmental control material holder 300 and the wafer cassette 318 are placed within the outer shell 316 to assemble the wafer carrier 314.

In an embodiment, environmental control material holder 300 may be formed as a single piece. In an embodiment, environmental control material holder 300 may be formed by, for example by one or more of injection molding, three-dimensional printing, machining, thermal forming, stamping, or any other suitable manufacturing methods. Environmental control material holder 300 may include a compatible material for contact with a wafer cassette, for example, the contact at arms 310. Environmental control material holder 300 may include a compatible material for contact with an outer shell 316 of the wafer carrier 314, for example, the contact at outer surfaces of each of the bases 304 of the environmental control material retainers 302. The compatible material may be a suitable polymer material selected for reduced particle generation when contacting the material of the wafer cassette 318 or the outer shell 316. In an embodiment, the compatible material is a polyolefin. In an embodiment, the compatible material is a material selected from polyolefins, polyether ether ketone (PEEK), perfluoroalkoxy alkane (PFA), or any other suitable melt-processable polymers, and combinations thereof. In an embodiment, the compatible material is polypropylene. In an embodiment, the entire environmental control material holder 300 may be made of the compatible material.

Figure 5C:
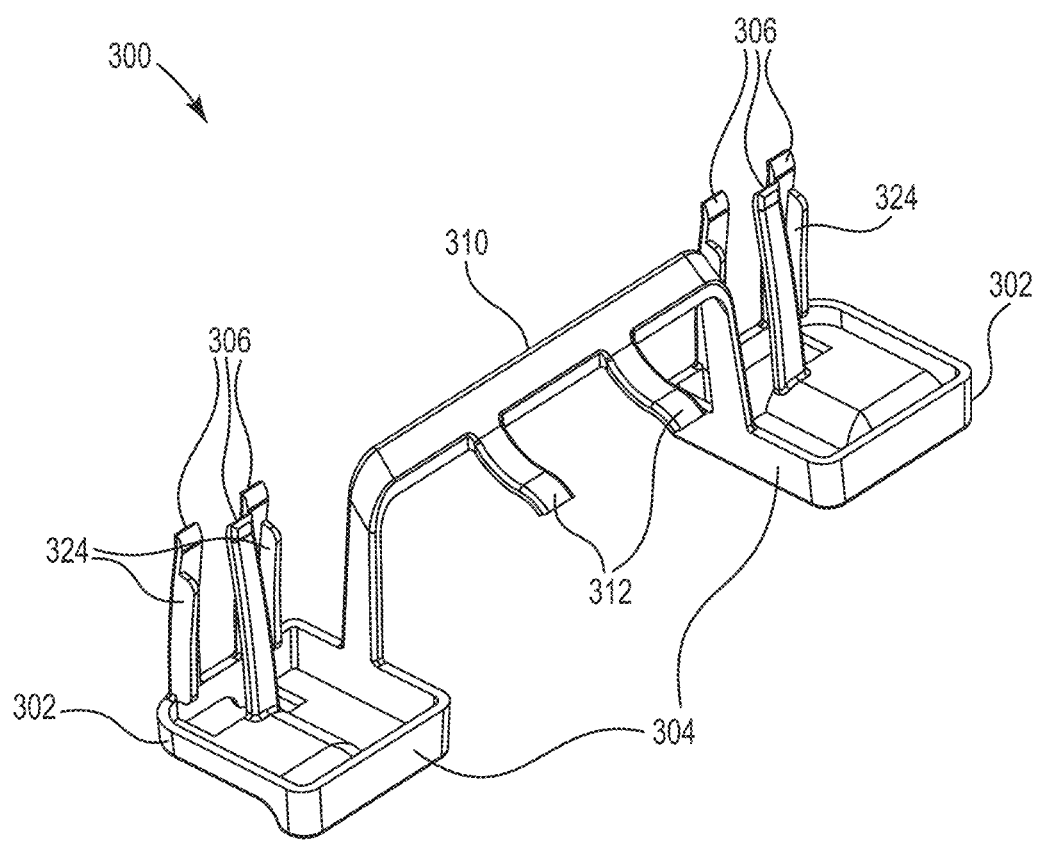
FIG. 5C shows the environmental control material holder of FIG. 5A.

FIG. 5C shows an environmental control material holder 300 according to an embodiment. As in the embodiments shown in FIGS. 5A and 5B, the environmental control material holder 300 includes two or more environmental control material retainers 302. Each of the environmental control material retainers 302 includes a base 304 and two or more beams 306. The two or more beams 306 of environmental control material retainer 302 are configured to hold an environmental control material 308 between them. The environmental control material retainers 302 are joined by arms 310, each of the arms 310 extending between two of the environmental control material retainers 302. Each of the arms 310 includes one or more spring arms 312.

In the embodiment shown in FIG. 5C, the outermost beams 306 of the plurality of beams 306 of each of the environmental control material retainers 302 include retention tabs 324. The outermost beams 306 can be defined as the beams 306 that are at opposing ends of the plurality of the beams 306. The retention tabs 324 extend outwards from the beams 306 to which they are attached. In an embodiment, the retention tabs 324 extend towards one or more of the beams 306 opposing the beam 306 that they extend from. In an embodiment, the retention tabs 324 contact the environmental control material 308. In an embodiment, the retention tabs 324 partially define a space between the outermost beams 306 where the environmental control material 308 is located.

Figure 5D:
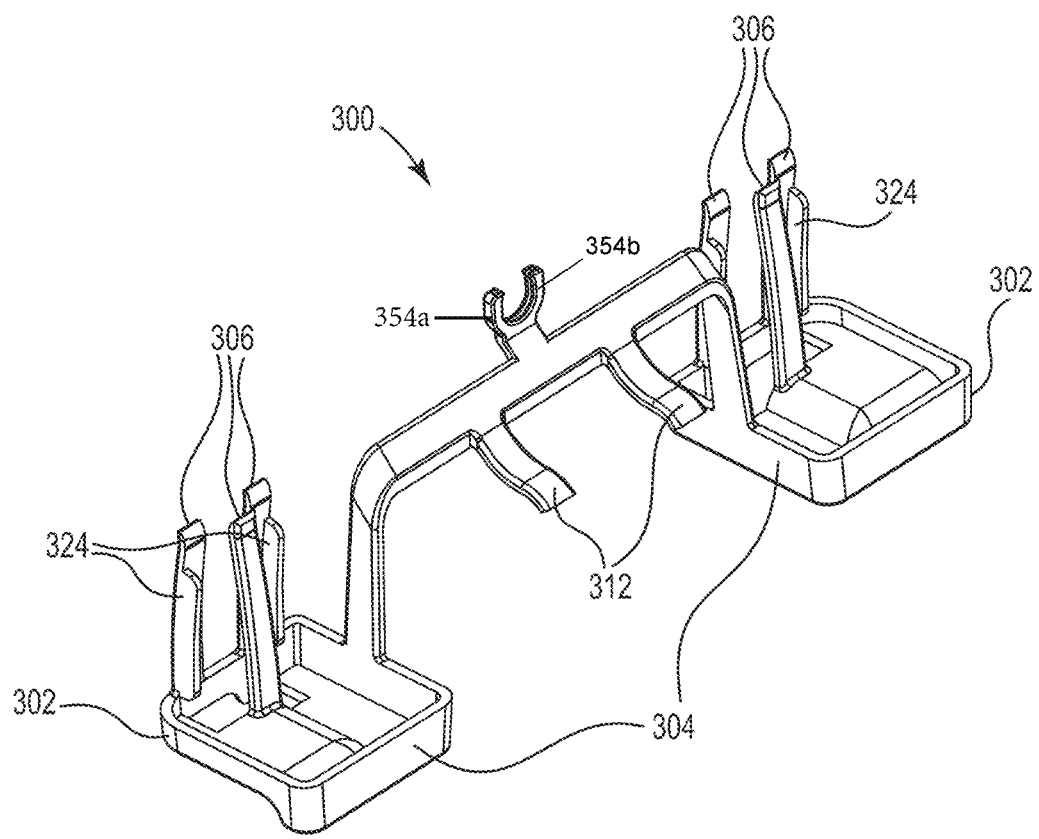
FIG. 5D shows the environmental control holder of FIG. 5A including retention features for a humidity indicator provided in accordance with another embodiment of the disclosure.

FIG. 5D shows an alternate embodiment of environmental control material holder 300 including a retention feature 352 for receiving and retaining a humidity indicator card such as described herein. As shown in FIG. 5D, retention feature includes a pair of arms 354a, 354b. Arms 354a, 354b are spaced a part from another to define a gap. The gap has a width sufficient such that it is able to receive and retain a humidity indicator card through a frictional fit with a surface of the humidity indicator card. Arms 354a, 354b are shown as being generally U-shaped however, a number of shapes are contemplated.

Aspects:

Any one of aspects 1-7 can be combined with any one of aspects 8-14 and 15-20. Any one of aspects 8-14 can be combined with any one of aspects 15-20.

Aspect 1. An environmental control material holder for a wafer carrier, comprising:
a baseplate; and
one or more tabs, at least one of the one or more tabs including a retaining feature configured to engage with a handle of a wafer cassette;
wherein the baseplate and each of the one or more tabs are spaced such that an environmental control material may be located within each of the one or more spaces.

Aspect 2. The environmental control material holder according to aspect 1, further comprising a plurality of environmental control material retention tabs extending from the baseplate and configured to retain the environmental control material in one of the one or more spaces.

Aspect 3. The environmental control material holder according to any of aspects 1-2, wherein the one or more tabs are a plurality of tabs, and the baseplate includes a channel located between two of the plurality of tabs in plan view.

Aspect 4. The environmental control material holder according to any of aspects 1-3, wherein the environmental control material holder includes at least one polymer material selected from the group consisting of: high-density polyethylene (HDPE), polypropylene (PP), polyether ether ketone (PEEK), perfluoroalkoxy alkane (PFA), and combinations thereof.

Aspect 5. The environmental control material holder according to any of aspects 1-4, further comprising an environmental control material including at least one of a desiccant, an ionic absorbent, or a volatile organic compound absorbent.

Aspect 6. The environmental control material holder according to aspect 5, wherein the environmental control material includes at least one of silica gel, bentonite clay activated charcoal, calcium sulfate, calcium chlorite, or zeolites Aspect 7. The environmental control material holder according to any of aspects 1-6, wherein the retaining feature is configured to form a snap-fit with the handle of the wafer cassette.

Aspect 8. An environmental control material holder for a wafer carrier, comprising:
a pin configured to interface with an aperture of a wafer cassette, located at a first end of the environmental control material holder;
a securing feature configured to engage with a wafer cassette, located at a second end of the environmental control material holder, opposite the first end; and
an environmental control material retainer, including one or more beams.

Aspect 9. The environmental control material holder according to aspect 8, wherein the environmental control material retainer comprises two beams, each of the beams including a retention tab extending from the beam.

Aspect 10. The environmental control material holder according to any of aspects 8-9, wherein the environmental control material retainer comprises a curved portion and a straight portion, the curved portion extending from the securing feature to a junction with the straight portion, the pin located at an end of the straight portion.

Aspect 11. The environmental control material holder according to aspect 10, wherein the straight portion includes side walls defining an internal space.

Aspect 12. The environmental control material holder according to any of aspects 8-11, wherein the environmental control material holder includes at least one polymer material selected from the group consisting of: high-density polyethylene (HDPE), polypropylene (PP), polyether ether ketone (PEEK), perfluoroalkoxy alkane (PFA), and combinations thereof.

Aspect 13. The environmental control material holder according to any of aspects 7-12, further comprising an environmental control material including at least one of a desiccant, an ionic absorbent, or a volatile organic compound absorbent.

Aspect 14. The environmental control material holder according to aspect 13, wherein the environmental control material includes at least one of silica gel, bentonite clay activated charcoal, calcium sulfate, calcium chlorite, or zeolites.

Aspect 15. An environmental control material holder for a wafer carrier, comprising:
one or more environmental control material retainers each including:
a base configured to fit in a corner of a base of a wafer carrier; and
a plurality of beams configured to retain an environmental control material.

Aspect 16. The environmental control material holder according to aspect 15, comprising a plurality of the environmental control material retainers;
one or more arms, each of the one or more arms connecting two environmental control material retainers of the plurality of environmental control material retainers; and
one or more spring arms extending from each of the one or more arms, each of the one or more spring arms configured to contact a wafer cassette when the bases of the plurality of environmental control material retainers are in the corners of the base of the wafer carrier and the wafer cassette is located within the wafer carrier.

Aspect 17. The environmental control material holder according to aspect 16, wherein two or more spring arms extend from each of the one or more arms.

Aspect 18. The environmental control material holder according to any of aspects 15-17, wherein the environmental control material holder includes at least one polymer material selected from the group consisting of: a polyolefin, polyether ether ketone (PEEK), perfluoroalkoxy alkane (PFA), and combinations thereof.

Aspect 19. The environmental control material holder according to any of aspects 15-18, further comprising an environmental control material including at least one of a desiccant, an ionic absorbent, or a volatile organic compound absorbent.

Aspect 20. The environmental control material holder according to aspect 19, wherein the environmental control material includes at least one of silica gel, bentonite clay activated charcoal, calcium sulfate, calcium chlorite, or zeolites.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respect, only illustrative. Changes may be made in details, particularly in matters of shape, size, and arrangement of parts without exceeding the scope of the disclosure. The disclosure's scope is, of course, defined in the language in which the appended claims are expressed.

The invention claimed is:

1. An environmental control material holder for a wafer carrier, comprising:
a baseplate; and
one or more tabs, at least one of the one or more tabs including a retaining feature configured to engage with a handle of a wafer cassette;
wherein, when the environmental control material holder is in a folded state, a surface of the baseplate and an opposite surface of each of the one or more tabs facing the baseplate are spaced apart from one another to define one or more spaces for retaining an environmental control material therein,
wherein the environmental control holder is configured to engage with the handle of the wafer cassette,
wherein the one or more tabs are configured to engage with the baseplate and the handle of the wafer cassette.

2. The environmental control material holder of claim 1, further comprising a plurality of environmental control material retention tabs extending from the baseplate.

3. The environmental control material holder of claim 1, wherein the one or more tabs are a plurality of tabs, and the baseplate includes a channel located between two of the plurality of tabs.

4. The environmental control material holder of claim 1, further comprising an environmental control material retained in at least one of the one or more spaces, the environmental control material including at least one of a desiccant, an ionic absorbent, or a volatile organic compound absorbent.

5. The environmental control material holder of claim 4, wherein the environmental control material includes at least one of silica gel, bentonite clay, activated charcoal, calcium sulfate, calcium chlorite, or zeolites.

6. The environmental control material holder of claim 1, further comprising a packet containing at least one environmental control material, the packet retained in at least one of the one or more spaces.

7. The environmental control material holder of claim 6, wherein the at least one environmental control material includes at least one of a desiccant, an ionic absorbent, or a volatile organic compound absorbent.

8. The environmental control material holder of claim 1, wherein the retaining feature is configured to form a snap-fit with a handle of a wafer cassette.

9. The environmental control material holder of claim 1, wherein at least one tab of the one or more tabs includes retention features configured to retain a humidity indicator.

10. The environmental control material holder of claim 1, further comprising at least one hinge joining at least one of the one or more tabs to the baseplate.

11. The environmental control material holder of claim 1, wherein the retaining feature includes a ramped surface configured to facilitate insertion of the environmental control material holder into a handle of a wafer cassette and an engagement surface configured to retain the environmental control material holder in place by way of contact a handle of a wafer cassette.

12. The environmental control material holder of claim 1, wherein the environmental control material holder is formed from at least one polymer material selected from the group consisting of: a polyolefin, a polyether ether ketone (PEEK), a perfluoroalkoxy alkane (PFA), and combinations thereof.

* * * * *